(12) United States Patent
Hatsuda et al.

(10) Patent No.: US 7,269,084 B2
(45) Date of Patent: Sep. 11, 2007

(54) SEMICONDUCTOR MEMORY DEVICE

(75) Inventors: Kosuke Hatsuda, Tokyo (JP); Takashi Ohsawa, Kanagawa (JP); Katsuyuki Fujita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/056,243

(22) Filed: Feb. 14, 2005

(65) Prior Publication Data

US 2006/0044794 A1    Mar. 2, 2006

(30) Foreign Application Priority Data

Aug. 24, 2004  (JP)  ............................. 2004-244087

(51) Int. Cl.
*G11C 7/02*  (2006.01)
(52) U.S. Cl. .................. 365/210; 365/207; 365/189.04
(58) Field of Classification Search ................ 365/210, 365/207, 189.04, 208, 205, 230.06, 230.08
See application file for complete search history.

(56) References Cited

U.S. PATENT DOCUMENTS 5,969,979 A    10/1999  Hirano
6,587,367 B1 *  7/2003  Nishimura et al. ......... 365/145
2005/0195680 A1 *  9/2005  Higashi et al. ............ 365/236
2005/0226070 A1 *  10/2005  Ohsawa ..................... 365/207

FOREIGN PATENT DOCUMENTS

JP    2003-100080    4/2003
JP    2004-362720    12/2004
WO   WO97/36300    10/1997

* cited by examiner

*Primary Examiner*—Anh Phung
*Assistant Examiner*—Dang Nguyen
(74) *Attorney, Agent, or Firm*—Oblon, Spivak, McClelland, Maier & Neustadt, P.C.

(57) ABSTRACT

The disclosure concerns a semiconductor memory device that includes memory cells that store data by accumulating or discharging an electric charge; memory cell arrays having a plurality of the memory cells disposed in a matrix; a plurality of word lines connected to the memory cells arrayed in rows of the memory cell arrays; a plurality of bit lines connected to the memory cells arrayed in columns of the memory cell arrays; a plurality of dummy cells arrayed in a row direction of the memory cell arrays and are connected to the bit lines; sense amplifiers detecting data within the memory cells by using an average value of electric characteristics of the dummy cells that store mutually different digital data as a reference signal; and a plurality of switching elements electrically connecting four or more of the bit lines in order to generate the reference signal.

19 Claims, 19 Drawing Sheets

300

SEMICONDUCTOR MEMORY DEVICE

CROSS-REFERENCE TO RELATED APPLICATIONS

This application is based upon and claims the benefit of priority from the prior Japanese Patent Application No. 2004-244087, filed on Aug. 24, 2004, the entire contents of which are incorporated herein by reference.

BACKGROUND OF THE INVENTION

1. Field of the Invention

The present invention relates to a semiconductor memory device.

2. Background Art

Semiconductor memory devices such as a dynamic random access memory (DRAM), a floating body cell (FBC), and a ferroelectric memory detect data "0" or "1", which is stored in a memory cell, by using a reference signal corresponding to an intermediate value between data "0" and data "1". An intermediate voltage or an intermediate resistance between data "0" and data "1" is used as the reference signal.

There is a method of providing a reference generating circuit that generates a reference signal. According to this method, the reference generating circuit supplies a reference signal which is common to a certain memory cell array. In this case, provision of one reference generating circuit is sufficient for a certain memory cell or for a plurality of memory cell arrays. Therefore, the area of the semiconductor memory device can be made relatively small.

However, because a predetermined reference signal is used in common for memory cell arrays, this has a possibility of a difficulty in identifying data when a threshold value or a resistance of memory cells varies due to changes in temperature and depending on manufacturing processes.

On the other hand, a method of providing a dummy cell in each bit line is available for generating a reference signal. According to this method, a dummy cell that stores data "0" is connected with a dummy cell that stores data "1", thereby generating an intermediate value between data "0" and data "1".

For example, a voltage, which is based on a sum of a cell current in a dummy cell that stores data "0" and a cell current in a dummy cell that stores data "1", is generated as a reference voltage. Further, a voltage based on a current, which is two times a cell current flowing through a memory cell to be detected, is compared with a reference voltage. With this arrangement, the semiconductor memory device can detect data "0" or "1" stored in the memory cell. Because a dummy cell is provided for each bit line, a variation in a threshold value or a resistance of a memory cell causes a variation in a threshold value or resistance of the dummy cell. Therefore, the method using a dummy cell makes it easier to identify data than the method using a reference generating circuit.

However, because the two dummy cells that store data "0" and data "1" respectively are used to generate reference signals, the reference signals have a large variation among them due to changes in temperature and depending on manufacturing processes. It is generally known that when reference signals have a large variation, data detection sensitivity in memory cells is deteriorated. Therefore, in order to further improve the data detection sensitivity, the variation of reference signals needs to be minimized (See Japanese Patent Application Laid-open No. 2003-100080 Publication).

SUMMARY OF THE INVENTION

A semiconductor memory device according to an embodiment of the present invention comprises memory cells that store data by accumulating or discharging an electric charge; a memory cell array that has a plurality of the memory cells disposed in a matrix; a plurality of word lines that are connected to the memory cells arrayed in rows of the memory cell arrays; a plurality of bit lines that are connected to the memory cells arrayed in columns of the memory cell arrays; a plurality of dummy cells that are arrayed in a row direction of the memory cell arrays and are connected to the bit lines; sense amplifiers that detect data within the memory cells by using an average value of voltages of the dummy cells as a reference signal, the dummy cells storing mutually different digital data; and a plurality of switching elements that electrically connect four or more of the bit lines in order to generate the reference signal.

A semiconductor memory device according to another embodiment of the present invention comprises memory cells that store data by accumulating or discharging an electric charge; a memory cell array that has a plurality of the memory cells disposed in a matrix; a plurality of word lines that are connected to the memory cells arrayed in rows of the memory cell arrays; a plurality of bit lines that are connected to the memory cells arrayed in columns of the memory cell arrays; a plurality of dummy cells that are arrayed in a row direction of the memory cell arrays and are connected to the bit lines; sense amplifiers that detect data within the memory cells by using an average value of voltages of the dummy cells as a reference signal, the dummy cells storing mutually different digital data; a plurality of first switching elements connected between bit lines adjacent to each other and connected in series to each other, the plurality of first switching elements turning on to generate the reference signal; and a plurality of second switching elements provided to the bit lines, one end of the second switching elements being connected to the bit line corresponding to the second switching element, the other end of the second switching elements being connected to each other in common, the plurality of second switching elements turning on to generate the reference signal.

A semiconductor memory device according to further embodiment of the present invention comprises memory cells that store data by accumulating or discharging an electric charge; a memory cell array that has a plurality of the memory cells disposed in a matrix; a plurality of word lines that are connected to the memory cells arrayed in rows of the memory cell arrays; a plurality of bit lines that are connected to the memory cells arrayed in columns of the memory cell arrays; a plurality of dummy cells that are arrayed in a row direction of the memory cell arrays and are connected to the bit lines; sense amplifiers that detect data within the memory cells by using an average value of voltages of the dummy cells as a reference signal, the dummy cells storing mutually different digital data; a first multiplexer connected between the sense amplifier and the bit lines which are connected to the dummy cells storing a first data; a second multiplexer connected between the sense amplifier and the bit lines which are connected to the dummy cells storing a second data; and a switching element connected between a first connection node and a second connection node, the first connection node being between the first multiplexer and the sense amplifier, the second connection node being between the second multiplexer and the sense amplifier.

DETAILED DESCRIPTION OF THE INVENTION

Exemplary embodiments according to the present invention will be described more specifically with reference to the drawings. Note that the invention is not limited by the embodiments. A first to sixth embodiments relate to a semiconductor memory device in an open-type bit line configuration, and a seventh and the rest of embodiments relate to a semiconductor memory device in a folded-type bit line configuration.

Figure 1:
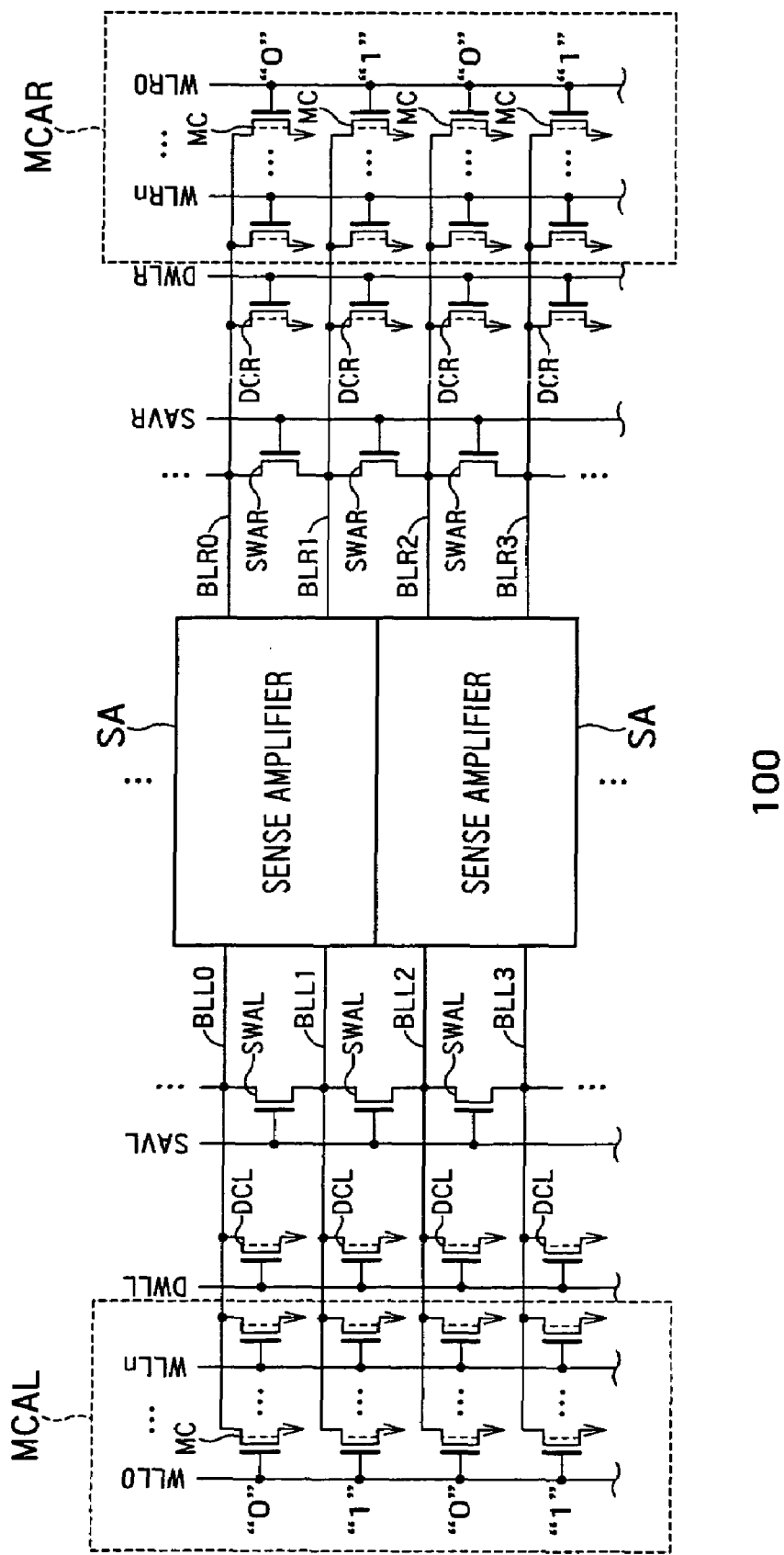
FIG. 1 is a circuit diagram of a semiconductor memory device 100 according to the first embodiment of the present invention.

FIG. 1 is a circuit diagram of a semiconductor memory device 100 according to the first embodiment of the present stored in a memory cell by using a reference signal. The semiconductor memory device 100 may be any one of a DRAM, an FBC memory, a ferroelectric memory, and a magnetic random access memory (MRAM), for example.

The semiconductor memory device 100 includes memory cells MCs, dummy cells DCLs and DCRs, switching elements SWALs and SWARs, and sense amplifier SAs. Each memory cell MC can store data "0" or data "1" by accumulating or discharging an electric charge. The memory cells MCs are disposed in a matrix, and constitute memory cell arrays MCAL and MCAR. The switching elements SWALs and SWARs are metal-oxide semiconductor field-effect transistors (MOSFETs), for example.

Drains of the memory cells MCs that are arrayed in columns of the memory cell arrays MCAL and MCAR are connected to bit lines BLL0 to BLLn and BLR0 to BLRn respectively, where n is a natural number. Gates of the memory cells MCs arrayed in rows of the memory cell arrays MCAL and MCAR are connected to word lines WLL0 to WLLn and WLR0 to WLRn respectively.

Dummy cells DCLs and DCRs are arrayed in a row direction of the memory cell arrays MCAL and MCAR respectively. The dummy cells DCLs are provided corresponding to the bit lines BLL0 to BLLn respectively, and are connected to the bit lines BLL0 to BLLn in respective drains. The dummy cells DCRs are provided corresponding to the bit lines BLR0 to BLRn respectively, and are connected to the bit lines BLR0 to BLRn in respective drains. Gates of the dummy cells DCLs and DCRs are connected in common to dummy word lines DWLL and DWLR respectively.

The dummy cells DCLs and DCRs that are connected to adjacent bit lines store mutually different digital data. Therefore, the dummy cells DCLs and DCRs store data "0" and data "1" alternately following the layout.

The switching elements SWALs and SWARs are arrayed in respectively. The switching elements SWALs and SWARs are connected to between adjacent bit lines respectively. The switching elements SWALs are connected in series. The switching elements SWARs are connected in series. Gates of the switching elements SWALs and SWARs are connected in common to signal lines SAVL and SAVR respectively.

Figure 2:
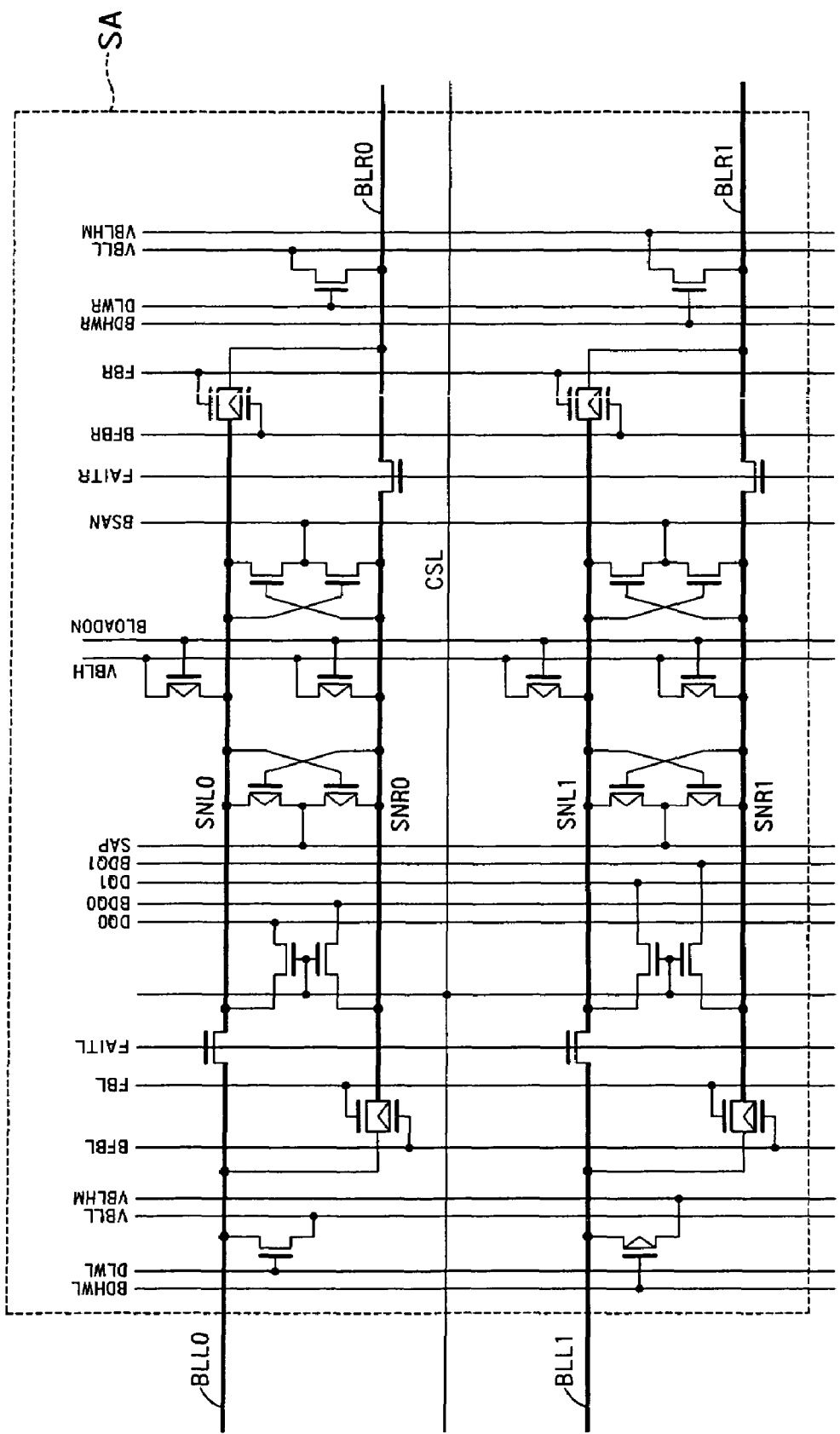
FIG. 2 is a configuration diagram of the sense amplifier SA of an open-type bit line configuration.

Sense amplifiers SAs are connected to adjacent two bit lines of the memory cell arrays MCAL and MCAR respectively. The semiconductor memory device 100 has an open-type bit line configuration. FIG. 2 is one example of a configuration of the sense amplifier SA. The bit lines BLL0, BLL1, BLR0, and BLR1 are provided at both sides of the sense amplifier SA. Bit lines at one side, for example, BLL0 and BLL1, transmit a reference signal respectively, and bit lines at the other side, for example, BLR0 and BLR1, transmit data of the memory cells MCs respectively. The sense amplifier SA amplifies a difference between a reference signal and data of a memory cell MC, thereby detecting the data.

Generation of reference signals is explained with reference to FIG. 1. In the present embodiment, it is assumed that reference signals are generated in the bit lines BLL0 to BLLn at the left side of the sense amplifier SAs shown in the diagram. In this case, the dummy word line DWLL and the signal line SAVL are activated. Based on this, data in the dummy cell DCLs are transmitted to the bit lines BLL0 to BLLn. Because the switching elements SWALs become in the ON state, all the bit lines BLL0 to BLLn are connected. Because the dummy cells DCLs store data "0" and data "1" alternately, the connection of all the bit lines BLL0 to BLLn causes the bit lines BLL0 to BLLn to be set with an intermediate voltage between data "0" and data "1".

At the time of data reading, the dummy word line DWLL and the signal line SAVL are actually activated during a period of about 5 to 30 nanoseconds. During only this activation time, a voltage of a certain bit line does not become an average voltage of all the dummy cells DCLs, but becomes an average voltage of dummy cells DCLs that are connected to a few (for example, 4 to 16) surrounding bit lines.

According to a conventional semiconductor memory device, a reference voltage is generated using two dummy cells that store data "0" and data "1". Therefore, a reference voltage has a large variation.

However, according to the present embodiment, a reference voltage becomes an average voltage of dummy cells DCLs connected to a certain bit line and a few (for example, 4 to 16) surrounding bit lines. Therefore, a variation of reference voltages becomes smaller than a conventional variation.

When the activation time of the dummy word line DWLL and the signal line SAVL is set long, data of more dummy cells DCLs can be averaged. Therefore, a variation of reference signals becomes smaller. However, the increase in the activation time of the dummy word line DWLL and the signal line SAVL lowers the operation speed of the semiconductor memory device 100. Accordingly, the activation time of the dummy word line DWLL and the signal line SAVL needs to be set in consideration of a tradeoff between a variation of reference signals and an operation speed of the semiconductor memory device 100.

Figure 3:
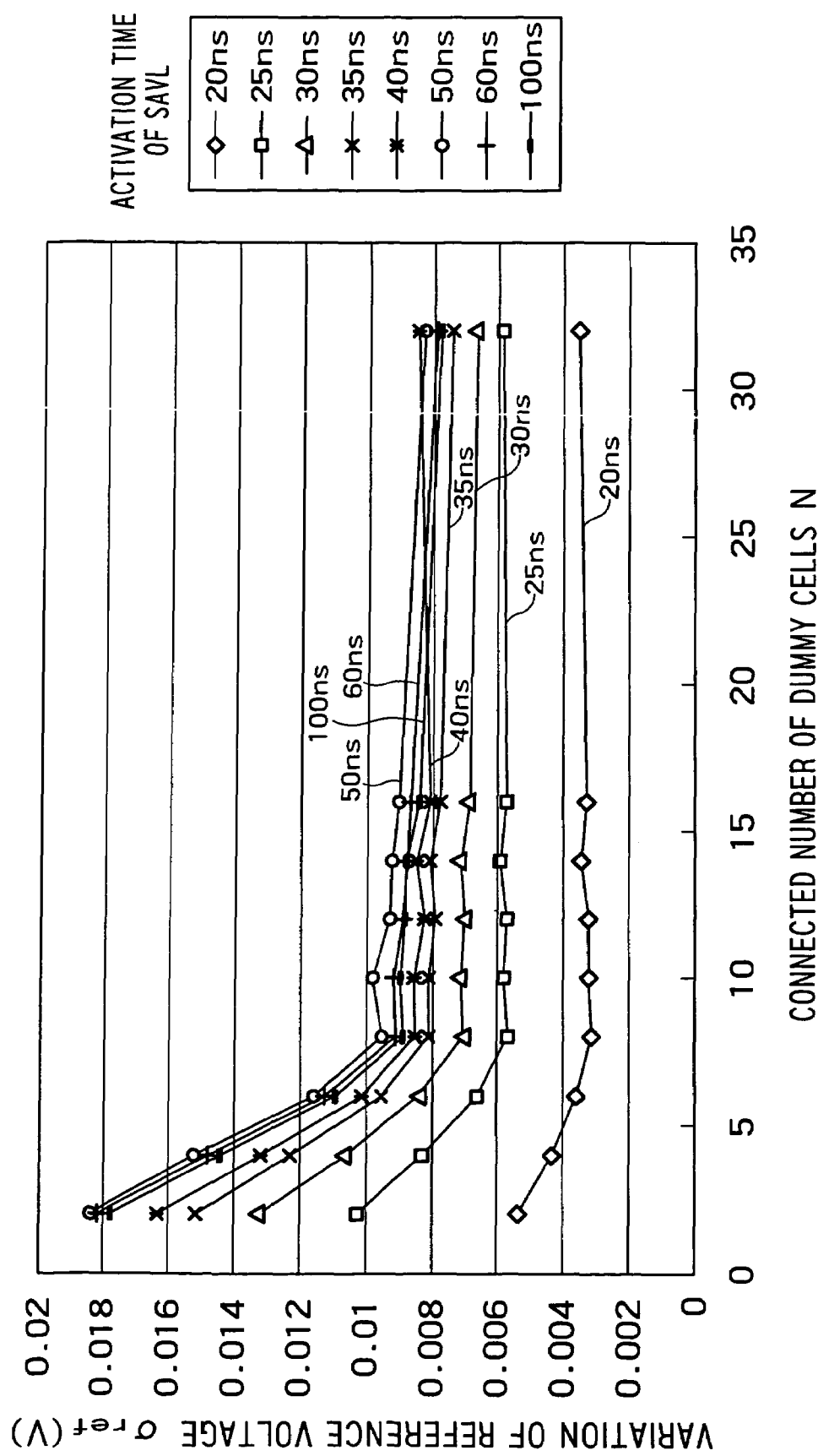
FIG. 3 is a graph of a relationship between a number N of connected dummy cells and a variation $\sigma_{ref}$ of reference voltages.

FIG. 3 is a graph of a relationship between a number N of dummy cells that are connected by the switching elements SWALs (hereinafter, a connected number N of dummy cells) to generate a reference voltage and a variation σref of reference voltages. This graph is obtained as a result of carrying out a Monte Carlo transient analysis as a simulation in order to calculate a variation. A standard deviation and an average value of a threshold value of an FBC cell used in the simulation substantially coincide with actual measurements.

This graph shows the variation σref by activation time of the signal line SAVL. When the connected number N of dummy cells increases, the variation σref becomes smaller. However, when the connected number N of dummy cells exceeds 7 or 8, a reduction of the variation σref slows down. When the connected number N of dummy cells exceeds 16, the variation σref makes substantially no change regardless of the activation time of the signal line SAVL. Reasons for this tendency are explained with reference to FIG. 4.

Figure 4:
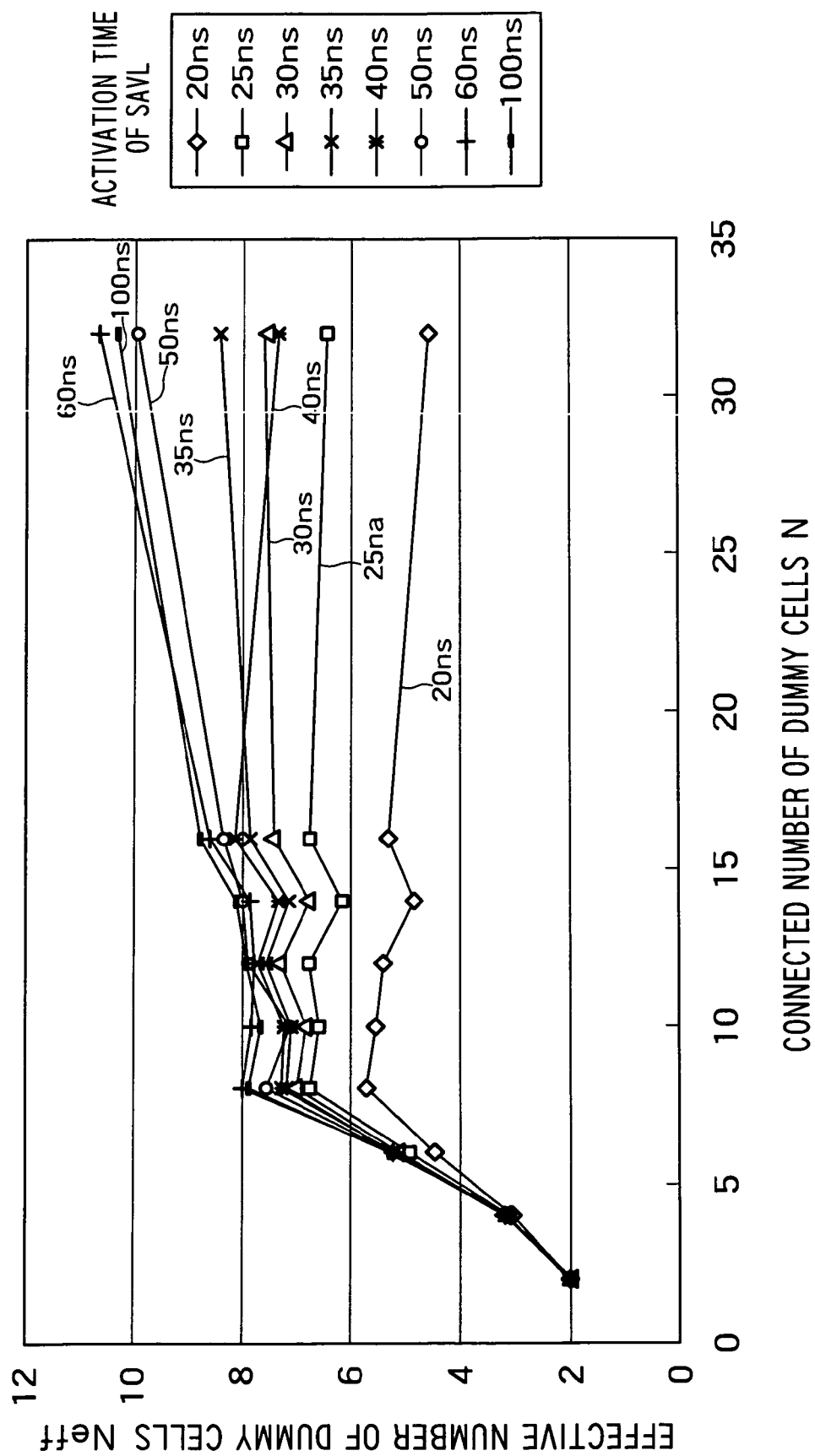
FIG. 4 is a graph of a relationship between the number N of connected dummy cells and a number Neff of effective dummy cells.

FIG. 4 is a graph of a relationship between the number N of dummy cells that are connected by the switching elements SWALs and a number Neff of dummy cells that are averaged by an actual electric connection (hereinafter, an effective number Neff of dummy cells). Neff is defined as Neff=2× (σref/σref')², where σref' is Neff=2 when N=2.

It takes some time for a plurality of dummy cells DCLs to be electrically connected and their voltages to be averaged. Therefore, even when the connected number N of dummy cells is large, the effective number Neff of dummy cells is small when the activation time of the signal line SAVL is as short as 20 to 100 nanoseconds.

For example, even when the connected number N of dummy cells exceeds 7 or 8, the effective number Neff of dummy cells is about 5 to 8. When the activation time of the signal line SAVL is less than 50 nanoseconds, the effective number Neff of dummy cells makes little change when the connected number N of dummy cells exceeds 16. As a result, as shown in FIG. 3, when the connected number N of dummy cells exceeds 7 or 8, a reduction of the variation σref slows down. When the connected number N of dummy cells exceeds 16, the variation σref makes substantially no change.

As explained above, according to the first embodiment, an average voltage of four or more dummy cells DCLs can be generated as a reference voltage. Therefore, the variation σref of the reference voltage becomes smaller than the conventional variation.

Figure 5:
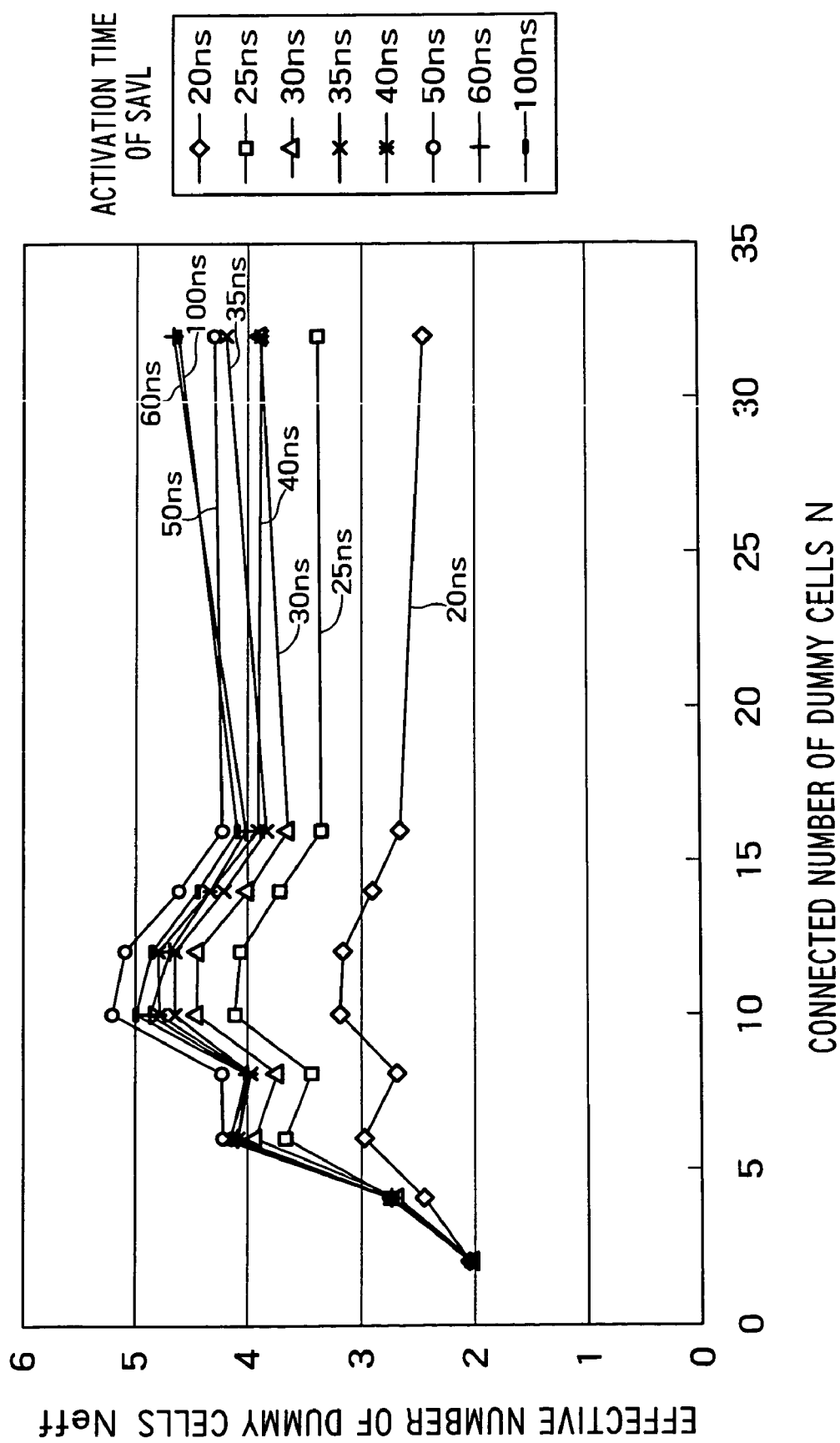
FIG. 5 is a graph of the number Neff of effective dummy cells at an end of the memory cell array MCAL.

FIG. 3 and FIG. 4 are the graphs of a trend of the data relationships at an intermediate part (i.e., an intermediate part of the word lines WLL0 to WLLn) of the memory cell array MCAL in a row direction. FIG. 5 is a graph of the effective number Neff of dummy cells at an end (i.e. an end of the word lines WLL0 to WLLn) of the memory cell array MCAL in a row direction.

When the signal line SAVL is activated, the bit lines at the center of the memory cell array MCAL are electrically connected to both directions of the layout of the series-connected switching elements SWALs. However, when the signal line SAVL is activated, the bit lines at the end of the memory cell array MCAL are electrically connected to one direction of the layout of the series-connected switching elements SWALs. Therefore, the effective number Neff of dummy cells at the end of the memory cell array MCAL becomes smaller than that at the intermediate part. As explained above, according to the first embodiment, there is a tendency that the effective number Neff of dummy cells at the end of the memory cell array MCAL is different from that at the intermediate part.

According to the first embodiment, the switching elements SWALs are provided between all the bit lines BLL0 to BLLn. However, even when the connected number N of dummy cells is large, the effective number Neff of dummy cells is smaller than 10, as described above. Therefore, the number of the switching elements SWALs can be reduced to some extent. For example, the omission of one switching element SWAL at every 4 to 10 bit lines does not cause the loss of the effect of the present embodiment. However, the number of dummy cells that store data "0" and the number of dummy cells that store data "1" need to be the same. Therefore, omission of one switching element SWAL at every even number bit lines is preferable.

SECOND EMBODIMENT

Figure 6:
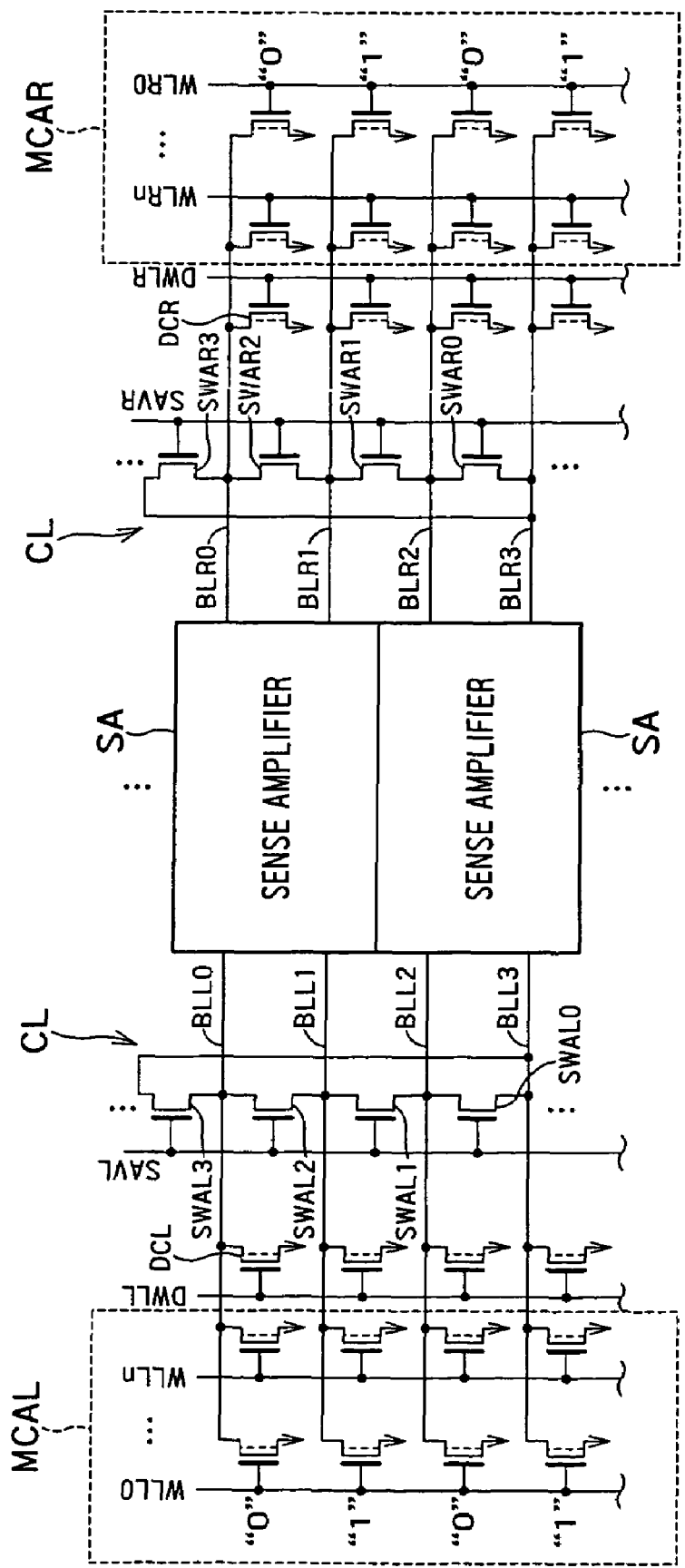
FIG. 6 is a circuit diagram of a semiconductor memory device 200 according to a second embodiment of the present invention.

FIG. 6 is a circuit diagram of a semiconductor memory device 200 according to a second embodiment of the present invention. The second embodiment is different from the first embodiment in that the switching elements SWALs and SWARs form connection loops at every four bit lines respectively.

According to the second embodiment, three switching elements SWAL0 to SWAL2 are connected between the four bit lines BLL0 to BLL3 respectively. A fourth switching element SWAL3 is connected between the switching element SWAL2 and the switching element SWAL0. With this arrangement, the four switching elements SWAL0 to SWAL3 are connected in series to form a connection loop CL. Switching elements SWAR0 to SWAR3 also form another connection loop CL in a similar manner to that of the switching elements SWAL0 to SWAL3.

According to the second embodiment, an average voltage of four dummy cells DCLs and DCRs respectively is generated as a reference voltage. With this arrangement, a variation of reference voltages is becomes smaller than the conventional variation.

According to the second embodiment, one connection loop CL is formed at every four bit lines. Alternatively, the connection loop CL can be formed at every six or more bit lines. However, the number of dummy cells that store data "0" and the number of dummy cells that store data "1" need to be the same, as described above. Therefore, formation of the connection loop CL at every even number bit lines is preferable.

According to the second embodiment, a bit line at the end of the memory cell array MCAL in a row direction is connected to the rest of three bit lines by the connection loop CL. Therefore, according to the second embodiment, the effective number Neff of dummy cells at the intermediate part of the memory cell array MCAL becomes equal to that at the end of the memory cell array MCAL. As a result, a variation between a reference voltage at the intermediate part and that at the end of the memory cell array MCAL is relatively small.

THIRD EMBODIMENT

Figure 7:
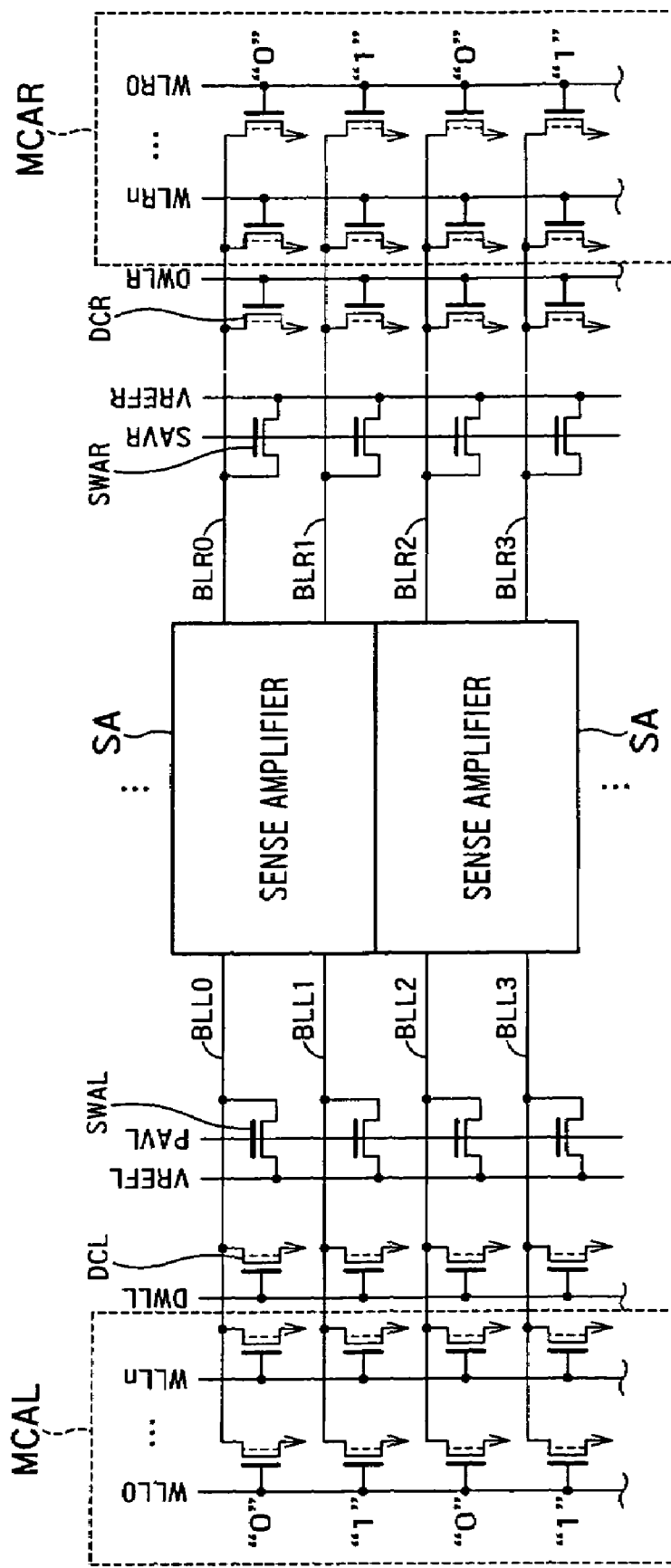
FIG. 7 is a circuit diagram of a semiconductor memory device 300 according to a third embodiment of the present invention.

FIG. 7 is a circuit diagram of a semiconductor memory device 300 according to a third embodiment of the present invention. According to the third embodiment, a plurality of switching elements SWALs are connected in parallel between the bit lines BLL0 to BLLn and a reference wiring VREFL respectively. Switching elements SWARs are connected in parallel between the bit lines BLR0 to BLRn and a reference wiring VREFR respectively. Other configurations of the semiconductor memory device 300 according to the third embodiment are similar to those according to the first embodiment.

A plurality of the switching elements SWALs are provided corresponding to the bit lines BLL0 to BLLn. One ends of the switching elements SWALs are connected to the bit lines BLL0 to BLLn respectively. The other ends of the switching elements SWALs are connected to the reference wiring VREFL respectively. The switching elements SWARs are provided corresponding to the bit lines BLR0 to BLRn. One ends of the switching elements SWARs are connected to the bit lines BLR0 to BLRn respectively. The other ends of the switching elements SWARs are connected in common to the reference wiring VREFR respectively. The bit lines BLL0 to BLLn and BLR0 to BLRn can be connected in parallel via the switching elements SWALs and SWARs respectively. The reference wiring VREFR may be a metal wiring or a polysilicon wiring. In order to lower resistance, the reference wiring VREFR is preferably a metal wiring.

Figure 8:
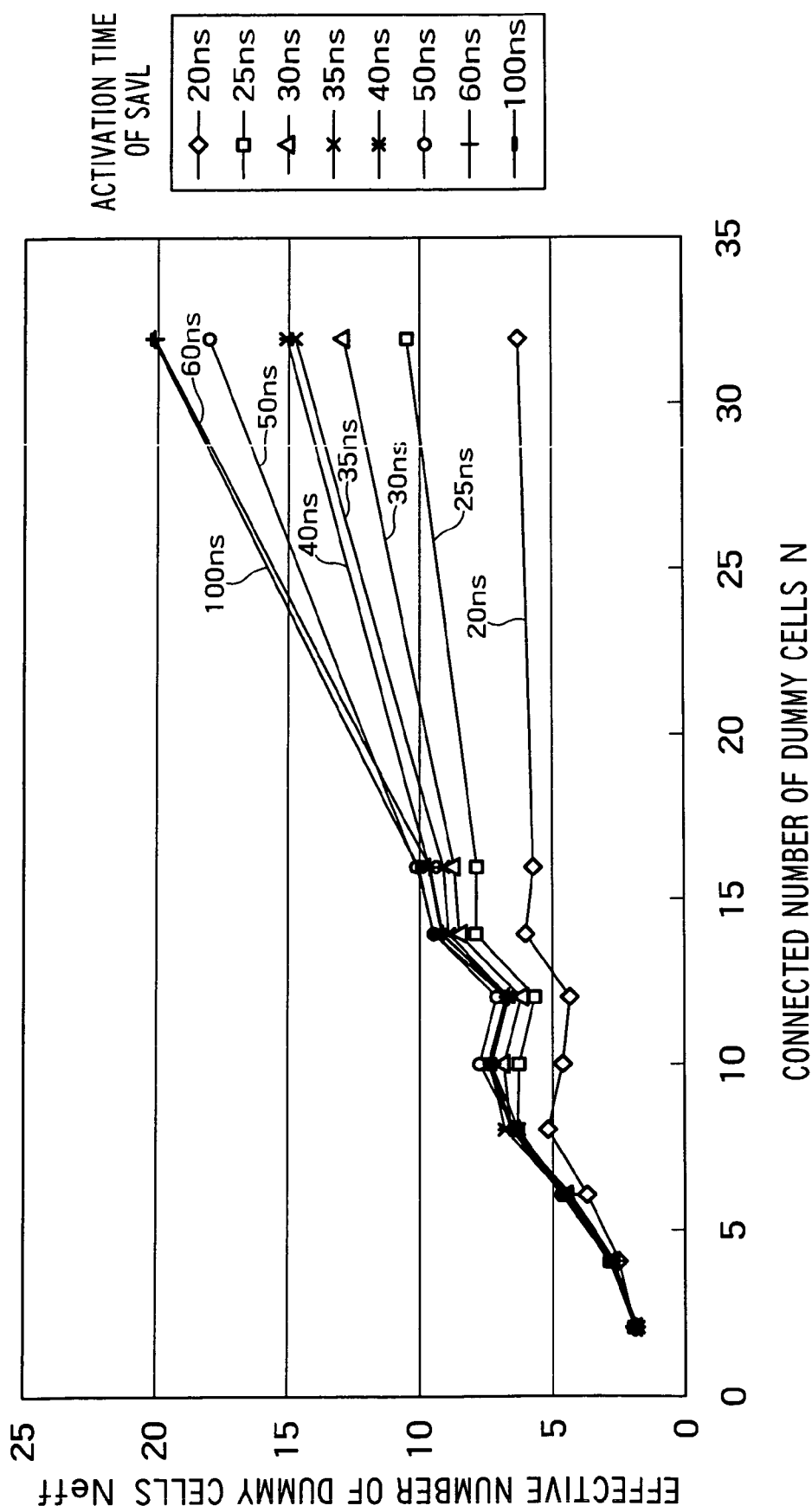
FIG. 8 is a graph of a relationship between the number N of connected dummy cells and a number Neff of effective dummy cells in the third embodiment.
Figure 9:
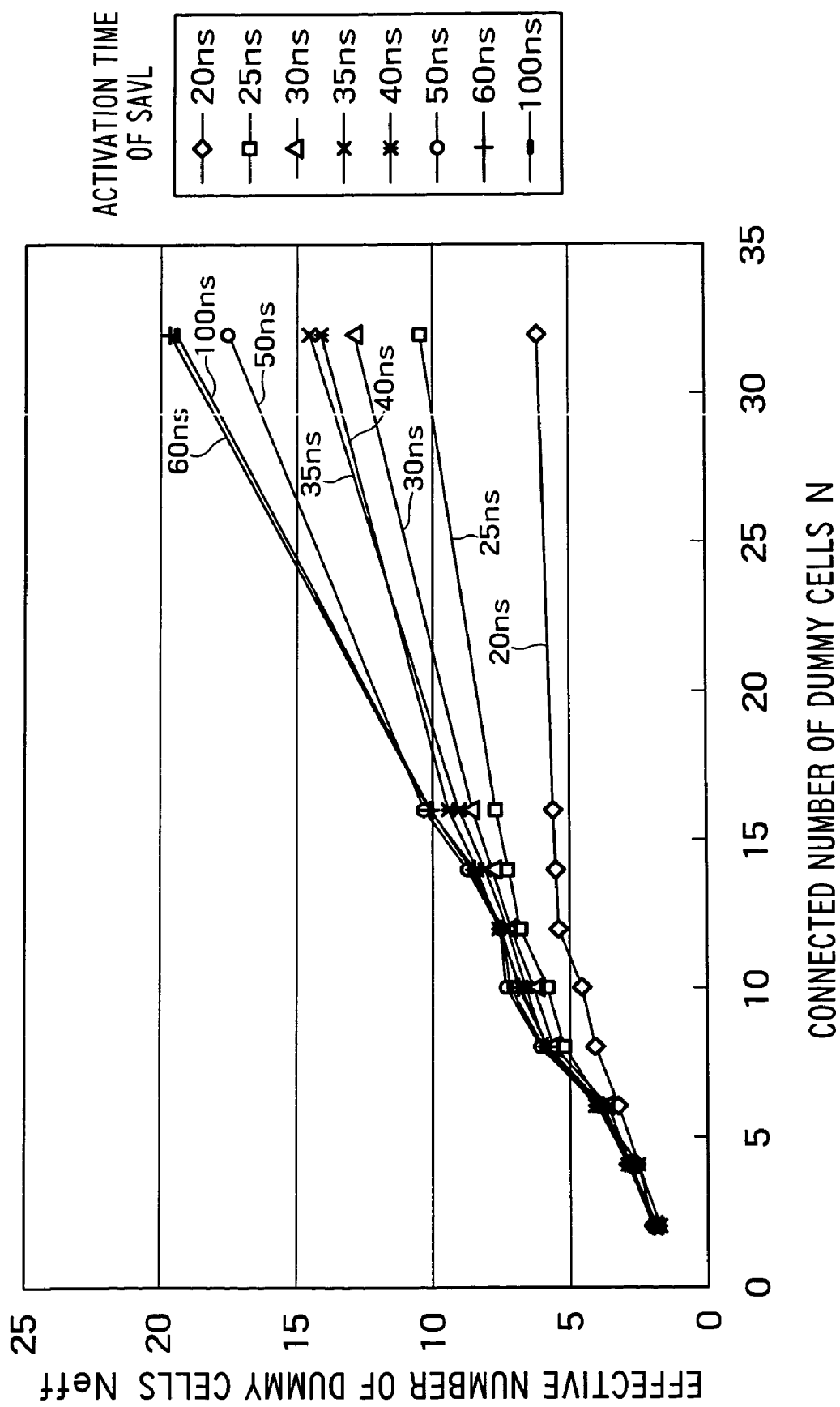
FIG. 9 is a graph of a relationship between the number N of connected dummy cells and a number Neff of effective dummy cells in the third embodiment.

FIG. 8 and FIG. 9 are graphs of a relationship between a connected number N of dummy cells and an effective number Neff of dummy cells according to the third embodiment respectively. FIG. 8 is the graph of the data relationship at an intermediate part of the memory cell array MCAL in a row direction. FIG. 9 is the graph of the data relationship at an end of the memory cell array MCAL in a row direction.

It is known from these graphs that when the connected number N of dummy cells increases, the effective number Neff of dummy cells also increases. This is because the bit lines BLL0 to BLLn are connected in parallel via the reference wiring VREFL of a low resistance, voltages of the dummy cells DCLs are transmitted fast and averaged fast.

In comparing the graphs in FIG. 8 and FIG. 9, it is known that the effective number Neff of dummy cells at the intermediate part and that at the end of the memory cell array MCAL make substantially no difference. This is because the bit lines BLL0 to BLLn are connected via the low-resistance reference wiring VREFL, voltages of the dummy cells DCLs at the intermediate part and at the end of the memory cell array MCAL are averaged without deviation.

As explained above, according to the third embodiment, a variation of reference voltages is smaller than the conventional variation. Further, a variation between a reference voltage at the intermediate part and the end of the memory cell array MCAL or MCAR is relatively small.

On the other hand, because reference voltages are generated in the reference wiring VREFL, the reference voltages are transmitted to the sense amplifier SAs via one switching element SWAL. Therefore, when the reference voltages reach the sense amplifier SAs, the reference voltages change corresponding to a resistance of only one switching element SWAL (refer to FIG. 14).

FOURTH EMBODIMENT

Figure 10:
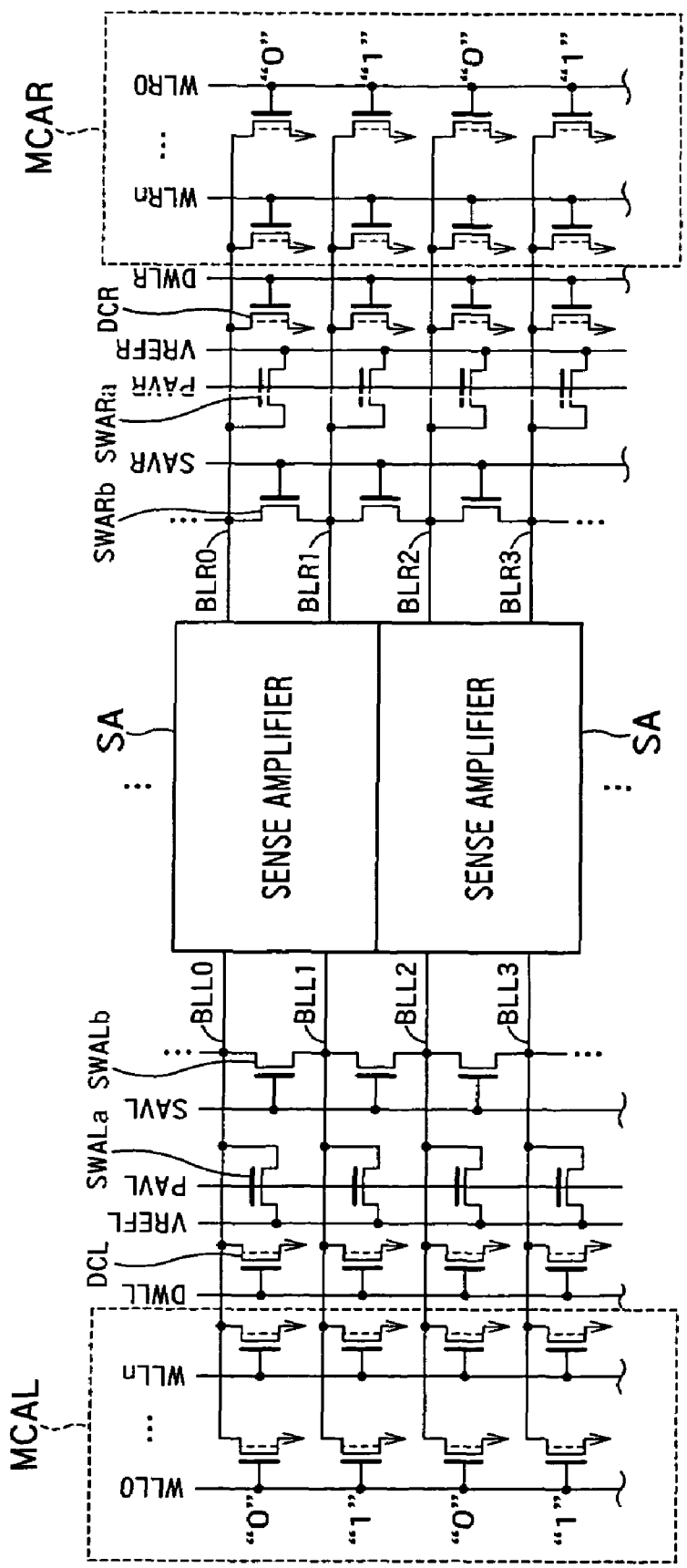
FIG. 10 is a circuit diagram of a semiconductor memory device 400 according to a fourth embodiment of the present invention.

FIG. 10 is a circuit diagram of a semiconductor memory device 400 according to a fourth embodiment of the present invention. The fourth embodiment is a combination of the first embodiment and the third embodiment. Switching elements SWALas are connected mutually in parallel between bit lines and the reference wiring VREFL. Switching elements SWALbs are connected in series between adjacent bit lines. Switching elements SWARas are connected mutually in parallel between bit lines and the reference wiring VREFR. Switching elements SWARbs are connected in series between adjacent bit lines. The switching elements SWALas, SWALbs, SWARas, and SWARbs are MOSFETs, for example.

The first and the third embodiment have a common effect that a variation of reference voltages can be made smaller than the conventional variation. However, according to the first embodiment, the effective numbers Neff of dummy cells at the intermediate part are different from those at the end of the memory cell arrays MCAL and MCAR in a row direction reference voltages at the intermediate part and those at the end of the memory cell arrays MCAL and MCAR respectively. On the other hand, according to the third embodiment, no variation occurs between reference voltages at the intermediate part and those at the end of the memory cell arrays MCAL and MCAR respectively. However, the reference voltages change corresponding to a resistance of one switching element SWAL.

On the other hand, the fourth embodiment can compensate for the drawbacks of the first and the third embodiments. Effects of the fourth embodiments are described with reference to FIG. 11 to FIG. 13.

Figure 11:
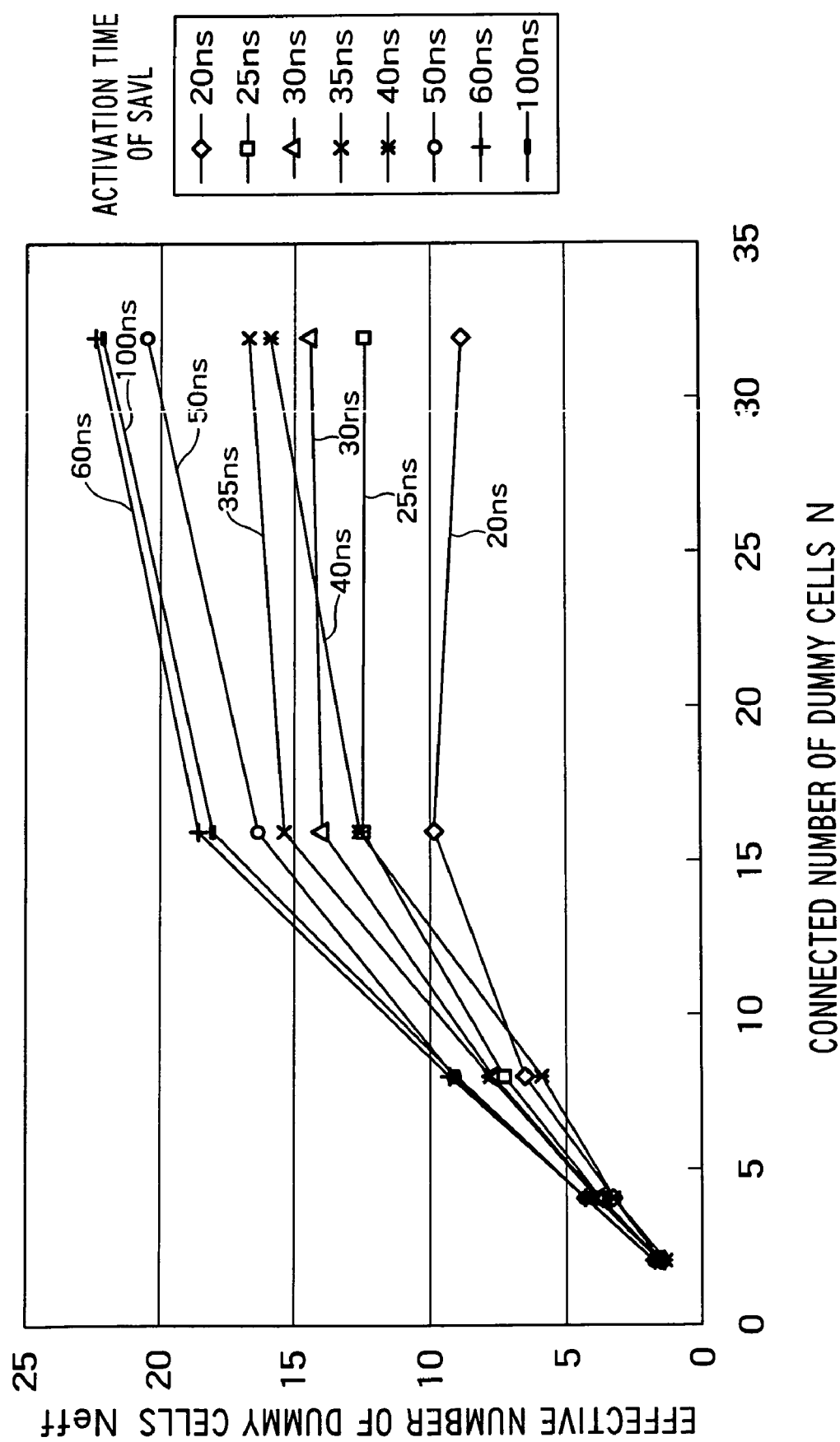
FIG. 11 is a graph of a relationship between the number N of connected dummy cells and a number Neff of effective dummy cells in the fourth embodiment.
Figure 12:
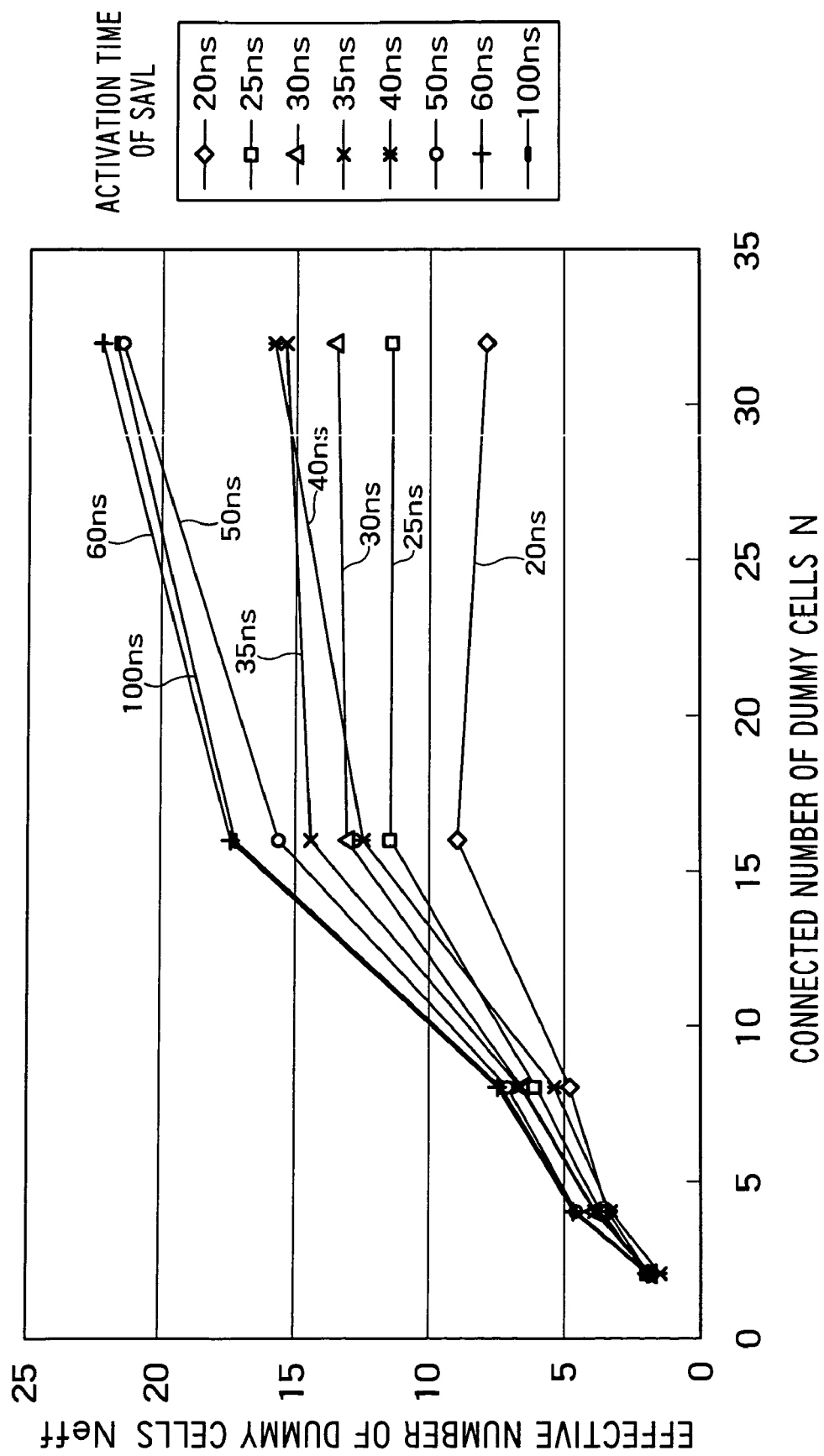
FIG. 12 is a graph of a relationship between the number N of connected dummy cells and a number Neff of effective dummy cells in the fourth embodiment.

FIG. 11 and FIG. 12 are graphs showing a relationship between a connected number N of dummy cells and an effective number Neff of dummy cells according to the fourth embodiment respectively. FIG. 11 is the graph of the data relationship at an intermediate part of the memory cell array MCAL in a row direction. FIG. 12 is the graph of the data relationship at an end of the memory cell array MCAL in a row direction. In comparing the graphs in FIG. 11 and FIG. 12, it is known that the effective number Neff of dummy cells at the intermediate part and that at the end of the memory cell array MCAL make substantially no difference. This is because the switching elements SWALas are connected in parallel between the bit lines BLL0 to BLLn and reference wiring VREFR.

Figure 13:
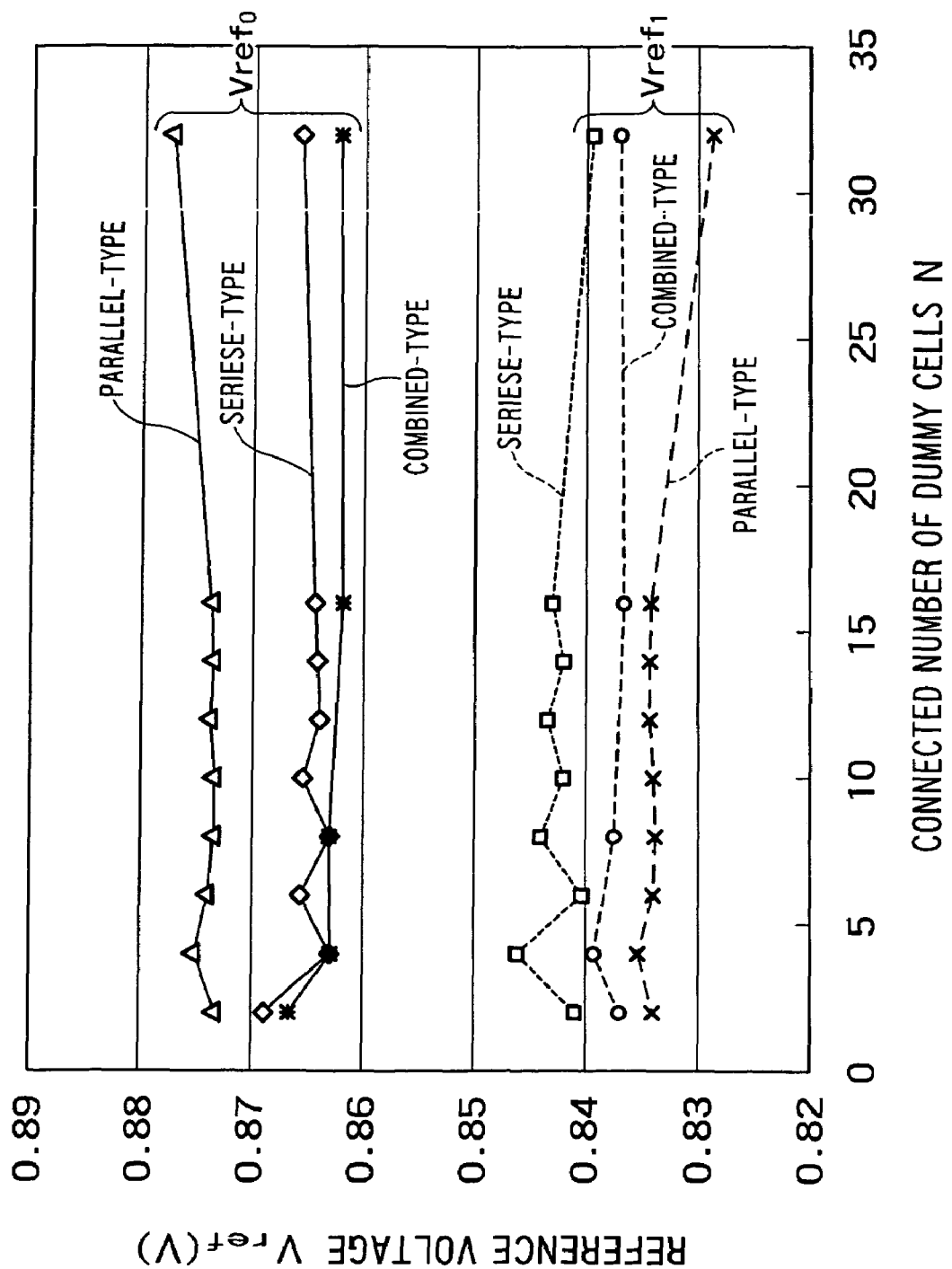
FIG. 13 is a graph showing a relationship between a reference voltage Vref and a number N of dummy cells connected by the switching elements SWALas and SWALbs.

FIG. 13 is a graph showing a relationship between a reference voltage Vref and a number N of dummy cells connected by the switching elements SWALas and SWALbs. Solid lines express a reference voltage Vref0 in a bit line connected to a dummy cell DCL that stores data "0", and broken lines express a reference voltage Vref1 in a bit line connected to a dummy cell DCL that stores data "1".

In FIG. 13, a semiconductor memory device that has the switching elements SWALs connected in series like in the first embodiment is called a "series semiconductor memory device". A semiconductor memory device that has the switching and the reference wiring VREFL like in the third embodiment is called a "parallel semiconductor memory device". A semiconductor memory device that is combination of the semiconductor memory device according to the first embodiment and the semiconductor memory device according to the third embodiment is called a "combined semiconductor memory device".

According to the parallel semiconductor memory device, a difference between the reference voltages Vref0 and Vref1 is relatively large as shown in FIG. 13. This is because when the reference voltages reach the sense amplifier SAs, the reference voltages change corresponding to a resistance of one switching element SWAL, as described above. When a difference between the reference voltages Vref0 and Vref1 is large as shown in FIG. 13, a detection of data in the memory cells MCs becomes difficult in some cases.

On the other hand, according to the series semiconductor memory device, reference voltages reach the sense amplifiers SAs without passing through the switching elements. Therefore, a difference between the reference voltages Vref0 and Vref1 is relatively small. According to the combined semiconductor memory device, there is substantially no difference between the effective number Neff of dummy cells at the intermediate part and that at the end of the memory cell array MCAL. Moreover, the combined semiconductor memory device has the effects of the series semiconductor memory device. Therefore, according to the combined semiconductor memory device, a variation of the reference voltages is the smallest among those according to the other embodiments described above.

FIFTH EMBODIMENT

Figure 14:
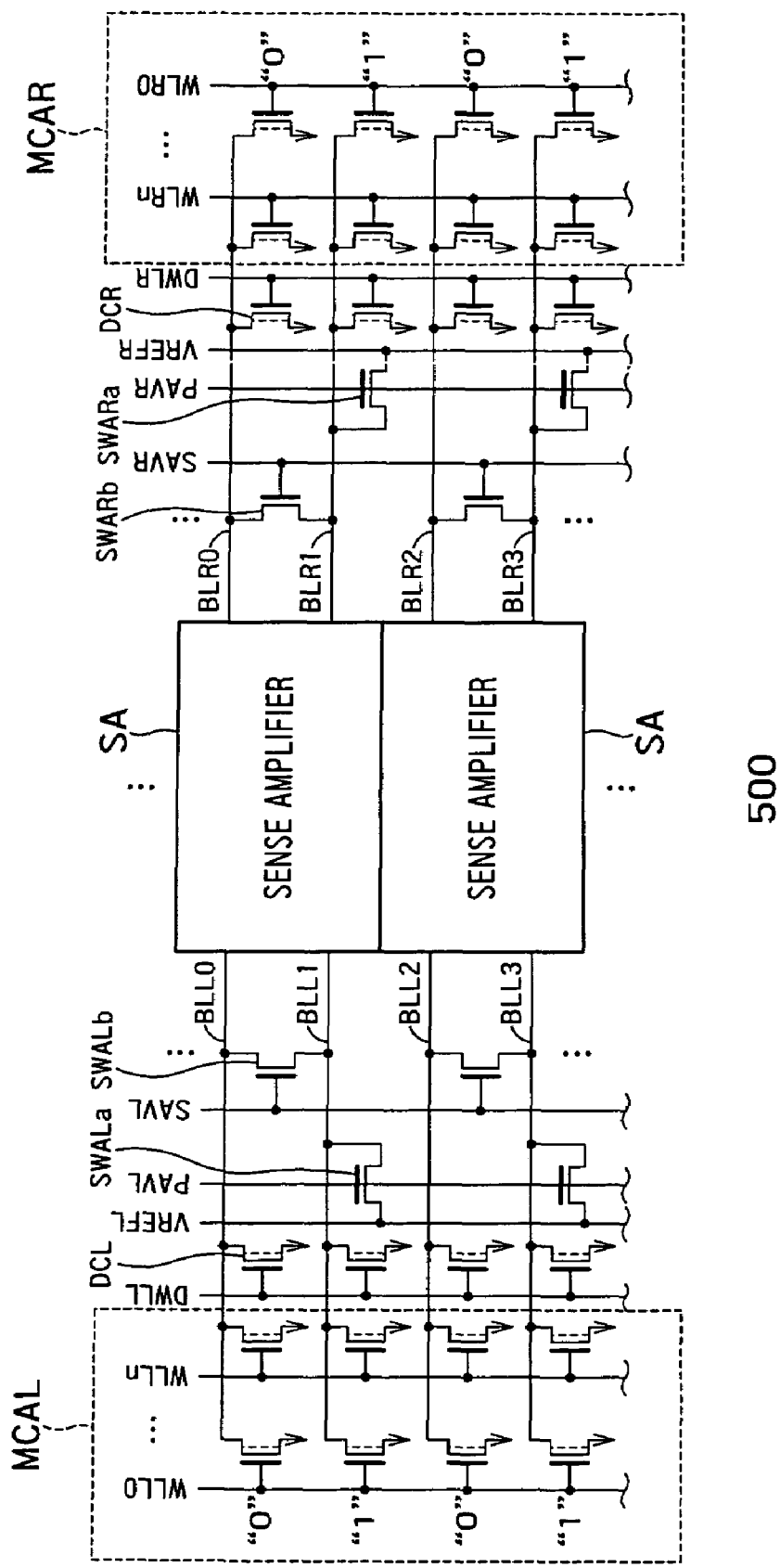
FIG. 14 is a circuit diagram of a semiconductor memory device 500 according to a fifth embodiment of the present invention.

FIG. 14 is a circuit diagram of a semiconductor memory device 500 according to a fifth embodiment of the present invention. The fifth embodiment is a combined semiconductor memory device. However, according to the fifth embodiment, each one of the switching elements SWALas, SWALbs, SWARas, Other configurations of the fifth embodiment can be the same as those according to the fourth embodiment.

One ends of the switching elements SWALas are connected to one of a pair of bit lines, and the other ends of the switching elements SWALas are connected in common to the reference wiring VREFL. In other words, the switching elements SWALs are connected in parallel between one bit line of the pair of bit lines and the reference wiring VREFL. One ends of the switching elements SWARas are connected to one of a pair of bit lines, and the other ends of the switching elements SWARas are connected in common to the reference wiring VREFR. In other words, the switching elements SWARas are connected in parallel between one bit line of the pair of bit lines and the reference wiring VREFR. The switching elements SWALbs and SWARbs are connected between a pair of bit lines provided for each sense amplifier SA.

According to the fifth embodiment, in order to generate a reference voltage, the switching elements SWALbs are connected between a pair of bit lines, and the switching elements SWALas are connected between a different pair of bit lines via the reference wiring VREFL. Accordingly, the fifth embodiment has effects similar to those according to the fourth embodiment.

SIXTH EMBODIMENT

Figure 15:
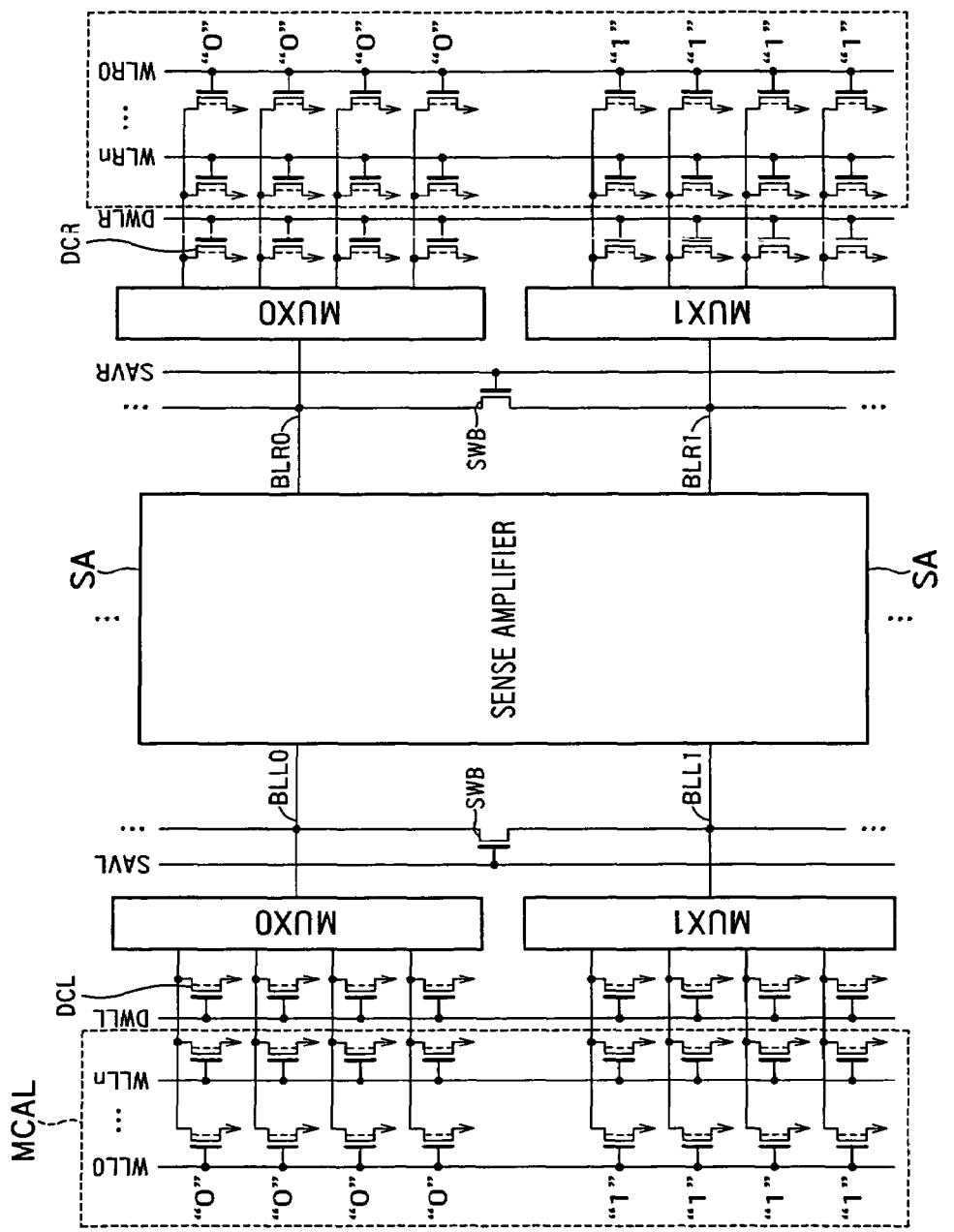
FIG. 15 is a circuit diagram of a semiconductor memory device 600 according to a sixth embodiment of the present invention.

FIG. 15 is a circuit diagram of a semiconductor memory device 600 according to a sixth embodiment of the present invention. The semiconductor memory device 600 has multiplexers MUX0s and MUX1s. The multiplexers MUX0s are connected between the sense amplifier SA and the bit lines that are connected to the dummy cells DCLs and DCRs which store data "0" respectively. The multiplexers MUX1s are connected between the sense amplifier SA and the bit lines that are connected to the dummy cells DCLs and DCRs which store data "1" respectively.

The bit lines BLL0 and BLR0 are connected respectively between the multiplexer MUX0 and the sense amplifier SA. The bit lines BLL1 and BLR1 are connected respectively between the multiplexer MUX1 and the sense amplifier SA. A switching element SWB is connected between the bit lines BLL0 and BLL1, and between the bit lines BLR0 and BLR1 respectively. The switching elements SWBs are MOSFETs, for example.

Assume that a reference voltage is generated in the bit lines BLL0 and BLL1 respectively at the left side of the sense amplifier SA. The multiplexer MUX0 selects k bit lines that are connected to the dummy cells DCLs which store data "0", and connects the k bit lines to the bit line BLL0. The multiplexer MUX1 selects k bit lines that are connected to the dummy cells DCLs which store data "1", and connects the k bit lines to the bit line BLL1. In other words, both the multiplexers MUX0 and MUX1 select the same number of dummy cells DCLs that store data "0" and that store data "1" respectively.

When the signal line SAVL is activated to turn on the switching element SWB, the bit lines BLL0 and BLL1 are connected to each other. As a result, a reference voltage is generated.

In this case, k is an integer of 2 or above. Accordingly, average voltages of four or more dummy cells DCLs can be generated as a reference voltage. As a result, according to the sixth embodiment, a variation of reference voltages can be made smaller than the conventional variation.

According to the first to the sixth embodiments, in order to detect data in the memory cells MCs at the right of the sense amplifier SA, a reference voltage is generated using the dummy cells DCLs at the left of the sense amplifier SA. Alternatively, in order to detect data in the memory cells MCs at the left of the sense amplifier SA, a reference voltage can be generated using the dummy cells DCR at the right of the sense amplifier SA.

SEVENTH EMBODIMENT

Figure 16:
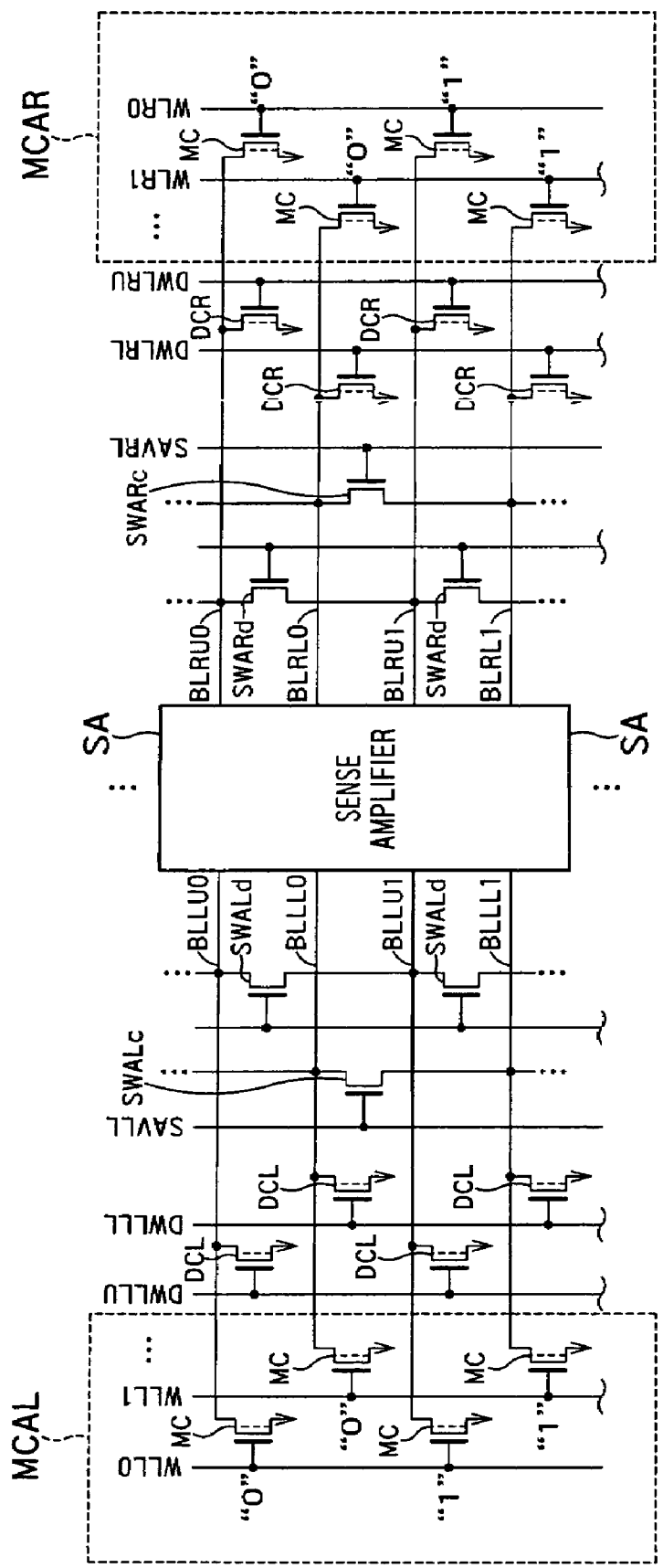
FIG. 16 is a circuit diagram of a semiconductor memory device 700 according to a seventh embodiment of the present invention.
Figure 17:
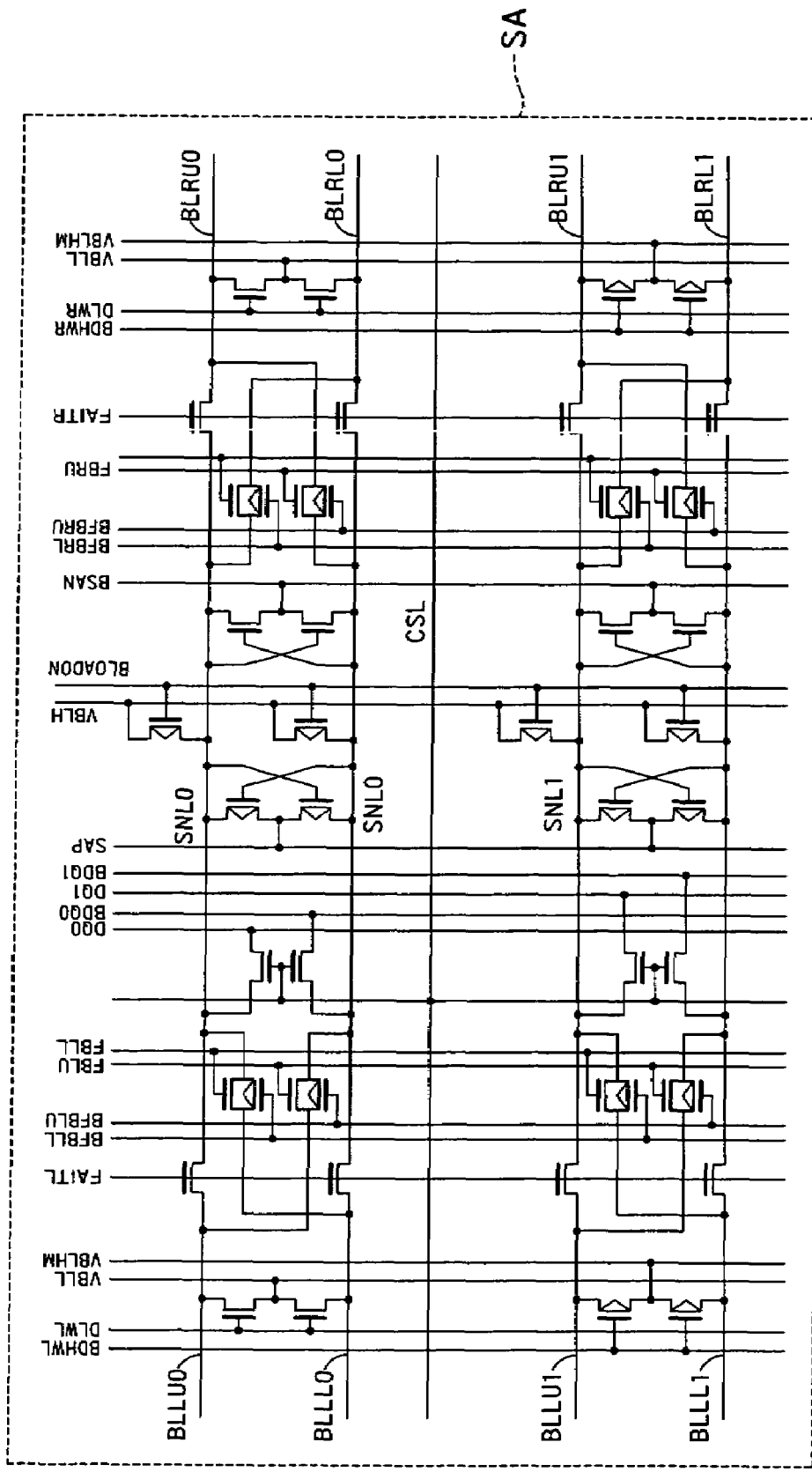
FIG. 17 is a configuration diagram of the sense amplifier SA of a folded-type bit line configuration.

FIG. 16 is a circuit diagram of a semiconductor memory device 700 according to a seventh embodiment of the present folded-type bit line configuration. Accordingly, four bit lines are connected to each one side of the sense amplifier SA. FIG. 17 is one example of a configuration of the sense amplifier SA.

According to a conventional folded-type semiconductor memory device, a reference voltage was generated in two bit lines out of four bit lines that were connected to one side of the sense amplifier SA, and data in memory cells MCs transmitted via the rest two bit lines was detected.

For example, data "0" is stored in the dummy cells DCLs that are connected to the bit lines BLL0 and BLLU0, shown in FIG. 16, and data "1" is stored in the dummy cells DCLs that are connected to the bit lines BLL1 and BLLU1.

A reference voltage was conventionally generated by connecting only the two bit lines of BLL0 and BLL1, or by connecting only the two bit lines of BLLU0 and BLLU1.

According to the seventh embodiment, switching elements SWALc and SWALd connect every other bit line of the bit lines arrayed in a row direction of the memory cell array MCAL respectively. In other words, when the bit lines are sequentially numbered in the layout order, the switching element SWALc, as a first switching element, electrically connects an even-numbered bit line. The switching element SWALd, as a second switching element, electrically connects an odd-numbered bit line. The switching elements SWALcs are connected in series, and the switching elements SWALds are connected in series. The switching elements SWALcs and SWALds are MOSFETs, for example.

Switching elements SWARc and SWARd connect every other bit line of the bit lines arrayed in a row direction of the memory cell array MCAR respectively. In other words, when the bit lines are sequentially numbered in the layout order, the switching element SWARc, as a first switching element, electrically connects an even-order bit line. The switching element SWARd, as a second switching element, electrically connects an odd-order bit line. The switching elements SWARds are connected in series. The switching elements SWARcs and SWARds are MOSFETs, for example.

According to the seventh embodiment, a reference voltage can be generated by connecting four or more bit lines. Therefore, a variation of reference voltages can be made smaller than the conventional variation, like in the first embodiment.

EIGHTH EMBODIMENT

Figure 18:
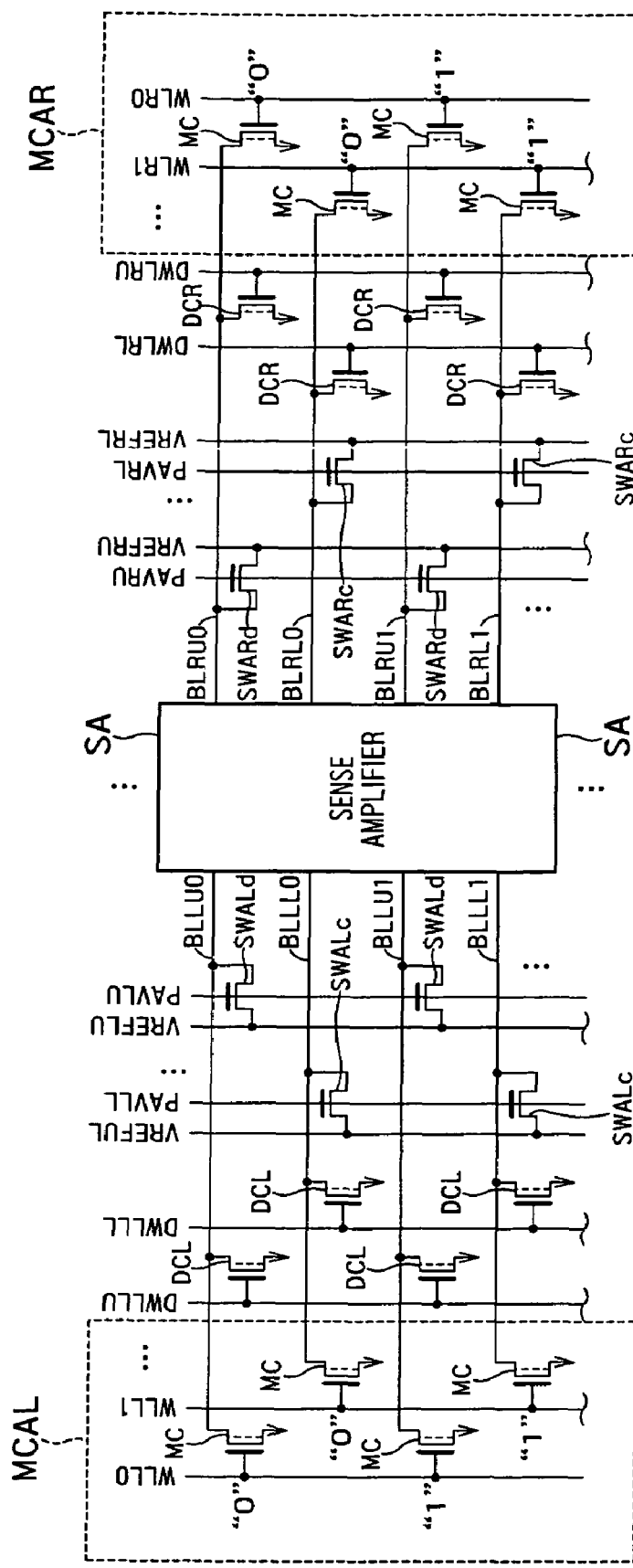
FIG. 18 is a circuit diagram of a semiconductor memory device 800 according to a eighth embodiment of the present invention.

FIG. 18 is a circuit diagram of a semiconductor memory device 800 according to an eighth embodiment of the present invention. According to the eighth embodiment, the switching elements SWALcs are connected in parallel via the reference wiring VREFLL, and the switching elements SWALds are connected in parallel via the reference wiring VREFLU.

According to the eighth embodiment, the switching elements SWALc and SWALd connect every other bit line of the bit lines arrayed in a row direction of the memory cell array MCAL via the reference wirings VREFLL and VREFLU respectively. In other words, when the bit lines are sequentially numbered in the layout order, the switching elements SWALcs are mutually connected in parallel between an even-order bit line and the reference wiring VREFLL. The switching elements SWALds are mutually connected in parallel between an odd-order bit line and the reference wiring VREFLU.

The switching elements SWARc and SWARd connect every other bit line of the bit lines arrayed in a row direction of the memory cell array MCAR via the reference wirings VREFRL and VREFRU respectively. In other words, when the bit lines are sequentially numbered in the layout order, the switching elements SWARcs are mutually connected in parallel between an even-order bit line and the reference wiring VREFRL. The switching elements SWARds are mutually connected in parallel between an odd-order bit line and the reference wiring VREFRU.

The reference wirings VREFLLs, VREFLUs, VREFRLs, and VREFRUs are metals or polysilicon, preferably metals of relatively low resistance.

According to the eighth embodiment, a reference voltage can be generated by connecting four or more bit lines. Therefore, a variation of reference voltages can be made smaller than the conventional variation, like in the first embodiment. Further, because low-resistance reference wirings connect between the dummy cells DCLs or DCRs, according to the eighth embodiment, a variation between a reference voltage at the intermediate part and that at the end of the memory cell array MCAL or MCAR is relatively small, like in the third embodiment.

NINTH EMBODIMENT

Figure 19:
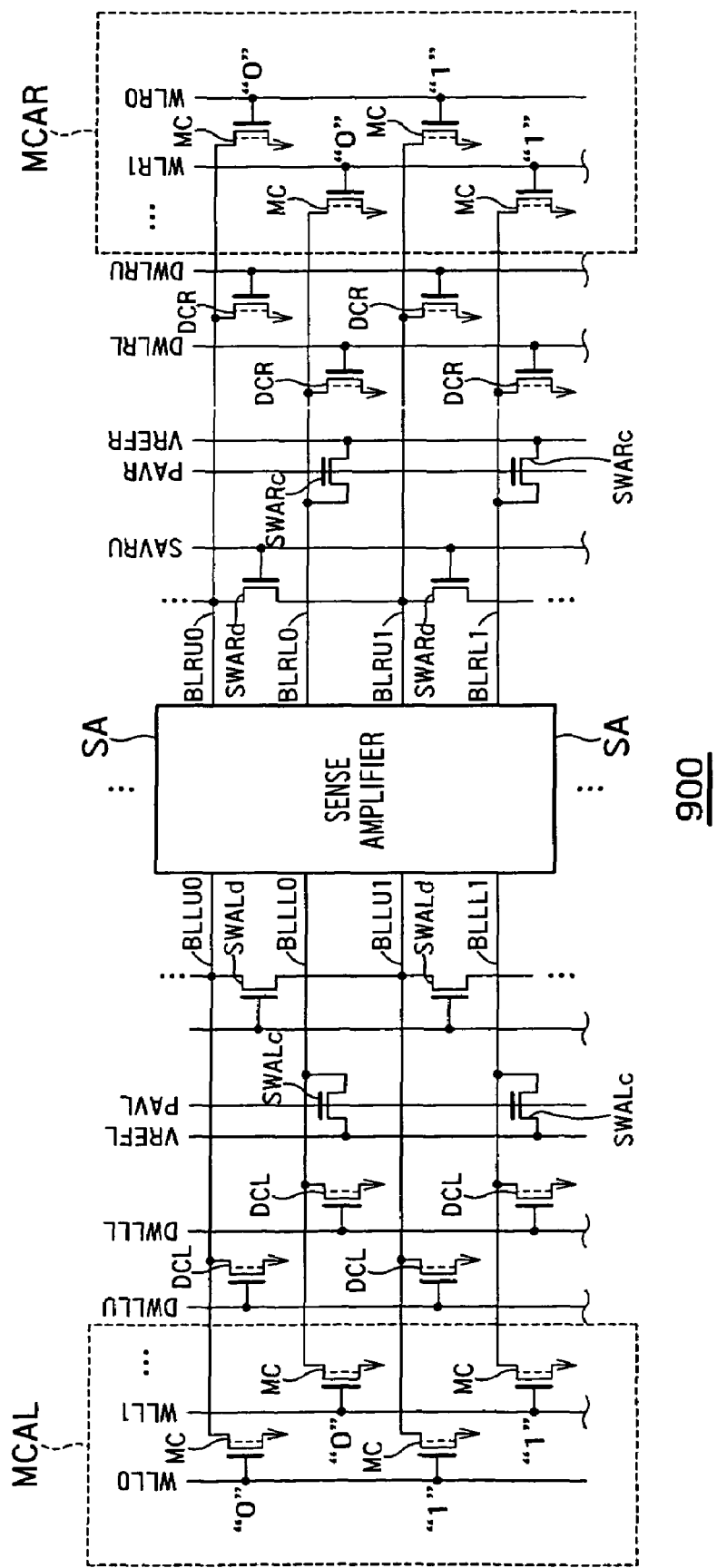
FIG. 19 is a circuit diagram of a semiconductor memory device 900 according to a ninth embodiment of the present invention.

FIG. 19 is a circuit diagram of a semiconductor memory device 900 according to a ninth embodiment of the present invention. The ninth embodiment is a combination of the seventh embodiment and the eighth embodiment. The switching elements SWALcs are mutually connected in parallel between the bit lines and the reference wiring VREFL. The switching elements SWALds are mutually connected in series between adjacent bit lines respectively. The switching elements SWARcs are mutually connected in parallel between the bit lines and the reference wiring VREFR. The switching elements SWARds are connected in series between adjacent bit lines respectively.

The seventh and the eighth embodiments have a common effect that a variation of reference voltages can be made smaller than the conventional variation. However, according to the seventh embodiment, the effective number Neff of dummy cells at the intermediate part of the memory cell array MCAL or MCAR is different from that at the end of the memory cell array in a row direction, like in the first embodiment. Meanwhile, according to the eighth embodiment, the reference voltages change corresponding to a resistance of one switching element SWAL.

On the other hand, according to the ninth embodiment, because the reference voltages reach the sense amplifiers SAs without pasing through the switching elements, an error of the reference voltages is relatively small. Further, the effective number Neff of dummy cells at the intermediate part and that at the end of the memory cell array MCAL make substantially no difference. In other words, the ninth embodiment can compensate for the respective drawbacks of the seventh and the eighth embodiments.

The invention claimed is:
1. A semiconductor memory device comprising:
memory cells that store data by accumulating or discharging an electric charge;
a memory cell array that has a plurality of the memory cells disposed in a matrix;
a plurality of word lines that are connected to the memory cells arrayed in rows of the memory cell arrays;
a plurality of bit lines that are connected to the memory cells arrayed in columns of the memory cell arrays;
a plurality of dummy cells that are arrayed in a row direction of the memory cell arrays and are connected to the bit lines;
sense amplifiers that detect data within the memory cells by using an average value of voltages of the dummy cells as a reference signal, the dummy cells storing mutually different digital data; and a plurality of switching elements that electrically connect four or more of the bit lines in order to generate the reference signal, wherein the switching elements are provided to correspond to each of the bit lines, one end of each switching element is connected to a corresponding bit line, and the other ends of the switching elements are connected together.

2. The semiconductor memory device according to claim 1, wherein the switching elements are connected between bit lines adjacent to each other and are connected in series.

3. The semiconductor memory device according to claim 1, wherein a first to a (m−1)-th (where m is an even number and is not less than 4) switching elements among the m switching elements are connected between two bit lines adjacent to each other among the m bit lines and are connected in series;

wherein a m-th switching element among the m switching elements is connected in series between the (m−1)-th switching element and the first switching element.

4. The semiconductor memory device according to claim 1, wherein the other ends of the switching elements are connected together through a metal interconnection.

5. The semiconductor memory device according to claim 1, wherein sense amplifier uses as a reference signal an average value of voltages of the dummy cells connected to a bit line at one side among the bit lines provided at both sides of the sense amplifier, and detects data of the memory cells connected to the bit lines at the other side.

6. The semiconductor memory device according to claim 1, wherein the dummy cells, which are connected to bit lines adjacent to each other, store mutually different digital data.

7. The semiconductor memory device according to claim 1, wherein the memory cells are FBC memory cells storing data by accumulating an electric charge in a floating body of the FBC memory cell or discharging an electric charge from the floating body.

8. A semiconductor memory device comprising:

memory cells that store data by accumulating or discharging an electric charge;

a memory cell array that has a plurality of the memory cells disposed in a matrix;

a plurality of word lines that are connected to the memory cells arrayed in rows of the memory cell arrays;

a plurality of bit lines that are connected to the memory cells arrayed in columns of the memory cell arrays;

a plurality of dummy cells that are arrayed in a row direction of the memory cell arrays and are connected to the bit lines;

sense amplifiers that detect data within the memory cells by using an average value of voltages of the dummy cells as a reference signal, the dummy cells storing mutually different digital data;

a plurality of first switching elements connected between bit lines adjacent to each other and connected in series to each other, the plurality of first switching elements turning on to generate the reference signal; and a plurality of second switching elements provided to the bit lines, one end of the second switching elements being connected to the bit line corresponding to the second switching element, the other end of the second switching elements being connected to each other in common, the plurality of second switching elements turning on to generate the reference signal.

9. The semiconductor memory device according to claim 8, wherein sense amplifier uses as a reference signal an average value of voltages of the dummy cells connected to a bit line at one side among the bit lines provided at both sides of the sense amplifier, and detects data of the memory cells connected to the bit lines at the other side.

10. The semiconductor memory device according to claim 8, wherein the memory cells are FBC memory cells storing data by accumulating an electric charge in a floating body of the FBC memory cell or discharging an electric charge from the floating body.

11. The semiconductor memory device according to claim 1, wherein the plurality of switching elements includes;

a plurality of first switching elements provided for the bit line pairs which consist of two bit lines adjacent to each other, the first switching elements connected between the two bit lines of the bit line pairs; and a plurality of second switching elements provided for the bit line pairs which consist of two bit lines adjacent to each other, one end of the second switching elements being connected to one of the bit lines in the bit line pair, the other end of the second switching elements being connected to each other in common;

wherein the first and second switching elements turning on to generate the reference signal.

12. The semiconductor memory device according to claim 11, wherein sense amplifier uses as a reference signal an average value of electric characteristics of the dummy cells connected to bit lines at one side among the bit lines provided at both sides of the sense amplifier, and detects data of the memory cells connected to the bit lines at the other side.

13. The semiconductor memory device according to claim 11, wherein the memory cells are FBC memory cells storing data by accumulating an electric charge in a floating body of the FBC memory cell or discharging an electric charge from the floating body.

14. A semiconductor memory device comprising:

memory cells that store data by accumulating or discharging an electric charge;

a memory cell array that has a plurality of the memory cells disposed in a matrix;

a plurality of word lines that are connected to the memory cells arrayed in rows of the memory cell arrays;

a plurality of bit lines that are connected to the memory cells arrayed in columns of the memory cell arrays;

a plurality of dummy cells that are arrayed in a row direction of the memory cell arrays and are connected to the bit lines;

sense amplifiers that detect data within the memory cells by using an average value of voltages of the dummy cells as a reference signal, the dummy cells storing mutually different digital data;

a first multiplexer connected between the sense amplifier and the bit lines which are connected to the dummy cells storing a first data;

a second multiplexer connected between the sense amplifier and the bit lines which are connected to the dummy cells storing a second data; and a switching element connected between a first connection node and a second connection node, the first connection node being between the first multiplexer and the sense amplifier, the second connection node being between the second multiplexer and the sense amplifier.

15. The semiconductor memory device according to claim 14, wherein sense amplifier uses as a reference signal an average value of voltages of the dummy cells connected to bit lines at one side among the bit lines provided at both sides of the sense amplifier, and detects data of the memory cells connected to the bit lines at the other side.

16. The semiconductor memory device according to claim 14, wherein the memory cells are FBC memory cells storing data by accumulating an electric charge in a floating body of the FBC memory cell or discharging an electric charge from the floating body.

17. The semiconductor memory device according to claim 1, wherein the plurality of switching elements includes;

a plurality of first switching elements that connect the even-numbered bit lines among the bit lines; and a plurality of second switching elements that connect the odd-numbered bit lines among the bit lines.

18. The semiconductor memory device according to claim 17, wherein the dummy cells that are connected to 2n-th (where n is a natural number) bit lines and 2(n+1)-th bit lines store mutually different digital data, and the dummy cells that are connected to (2n−1)-th bit lines and (2n+1)-th bit lines store mutually different digital data.

19. The semiconductor memory device according to claim 17, wherein the memory cells are FBC memory cells storing data by accumulating an electric charge in a floating body of the FBC memory cell or discharging an electric charge from the floating body.

* * * * *